(12) United States Patent
Togashi

(10) Patent No.: US 8,250,747 B2
(45) Date of Patent: Aug. 28, 2012

(54) METHOD OF MOUNTING CAPACITOR ARRAY

(75) Inventor: Masaaki Togashi, Tokyo (JP)

(73) Assignee: TDK Corporation, Tokyo (JP)

( * ) Notice: Subject to any disclaimer, the term of this patent is extended or adjusted under 35 U.S.C. 154(b) by 73 days.

(21) Appl. No.: 12/826,006

(22) Filed: Jun. 29, 2010

(65) Prior Publication Data

US 2011/0047794 A1  Mar. 3, 2011

(30) Foreign Application Priority Data

Aug. 25, 2009  (JP) .................................. 2009-194666

(51) Int. Cl.
  *H05K 3/30* (2006.01)
(52) U.S. Cl. ...... 29/832; 29/25.03; 29/25.42; 361/306.3
(58) Field of Classification Search ............ 29/832–834, 29/592.1, 25.35–25.42; 361/301.4, 306.1–306.3, 361/311–313
See application file for complete search history.

(56) References Cited

U.S. PATENT DOCUMENTS

| | | | |
|---|---|---|---|
| 7,436,648 B2 | 10/2008 | Togashi | |
| 7,558,049 B1 * | 7/2009 | Togashi et al. | 361/306.3 |
| 7,619,871 B2 | 11/2009 | Yoshida | |
| 7,724,497 B2 | 5/2010 | Yoshida | |
| 2011/0032655 A1 * | 2/2011 | Togashi | 361/301.4 |
| 2011/0047794 A1 * | 3/2011 | Togashi | 29/832 |

FOREIGN PATENT DOCUMENTS

| | | |
|---|---|---|
| JP | A-2000-277380 | 10/2000 |
| JP | A-2000-299249 | 10/2000 |
| JP | A-2004-259991 | 9/2004 |
| JP | A-2007-242801 | 9/2007 |
| JP | A-2008-47833 | 2/2008 |

* cited by examiner

*Primary Examiner* — Minh Trinh
(74) *Attorney, Agent, or Firm* — Oliff & Berridge, PLC

(57) ABSTRACT

A method is provided to mount a capacitor array onto a circuit board formed with first leads for connecting power lines to each other and a second lead for grounding. The method uses one of a first connection method of connecting such that first and second capacitor sections are parallel to each other, third capacitor section is in series with the parallel first and second capacitor sections; a second connection method of connecting such that the first to third capacitor sections are in series in sequence; and a third connection method of connecting such that the first and second capacitor sections are in series with each other without using the third capacitor section.

9 Claims, 23 Drawing Sheets

Fig.11
(a)
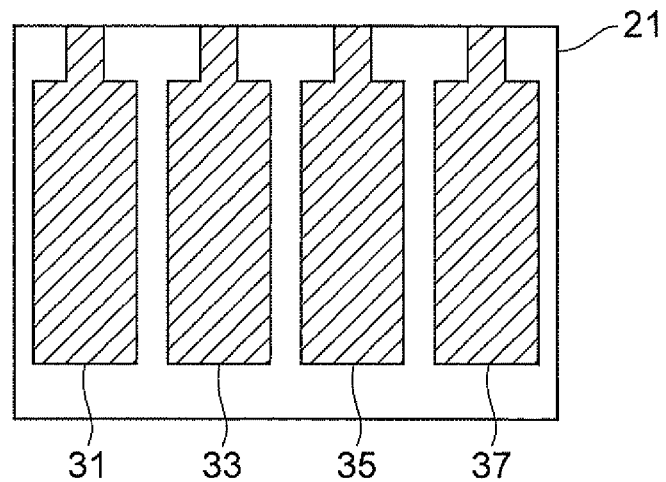
31  33  35  37
(b)
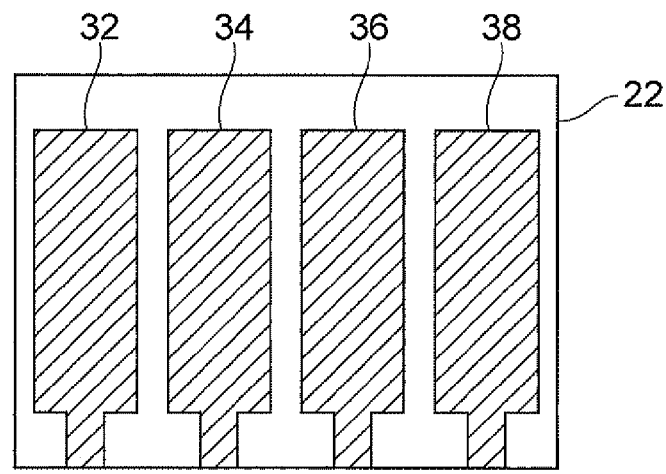

Fig.12
(a)
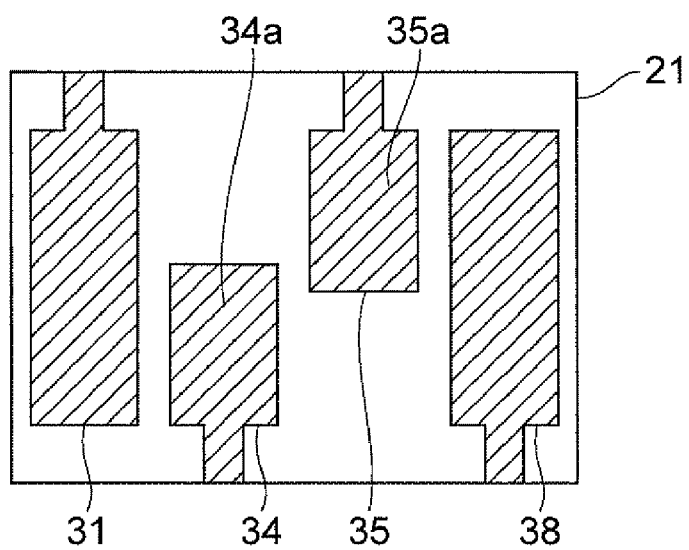
(b)
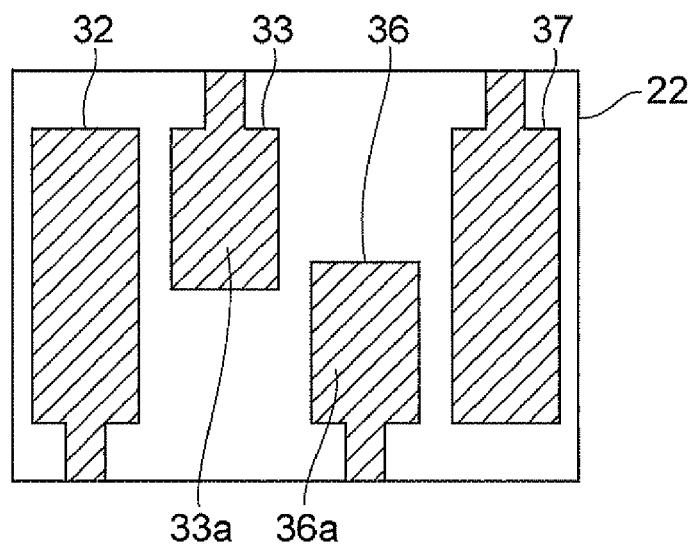

Fig.13
(a)
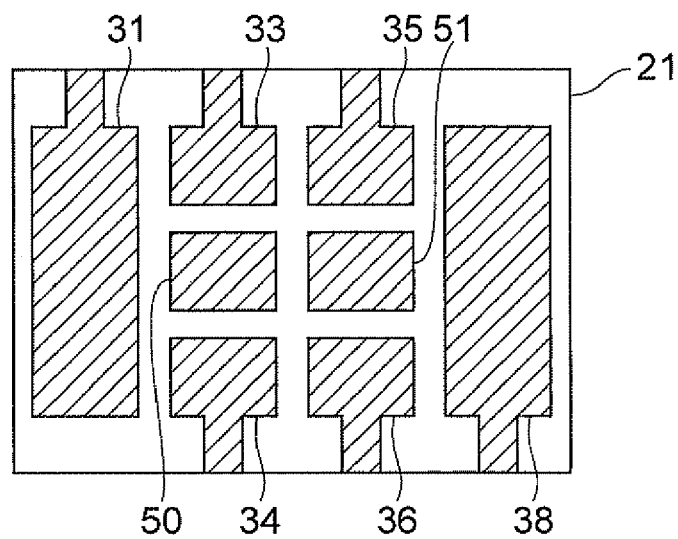
(b)
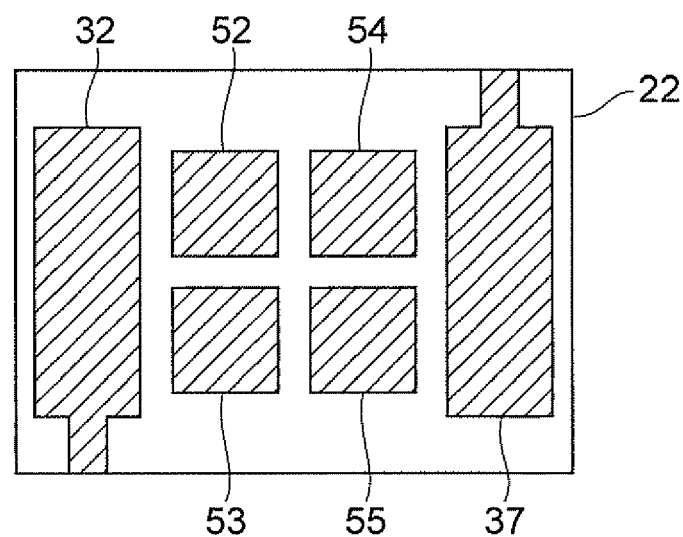

Fig.14
(a)
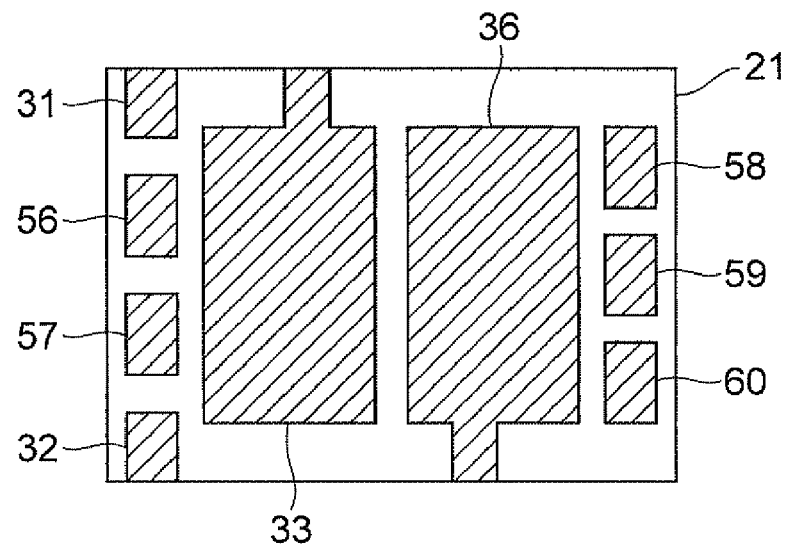
(b)
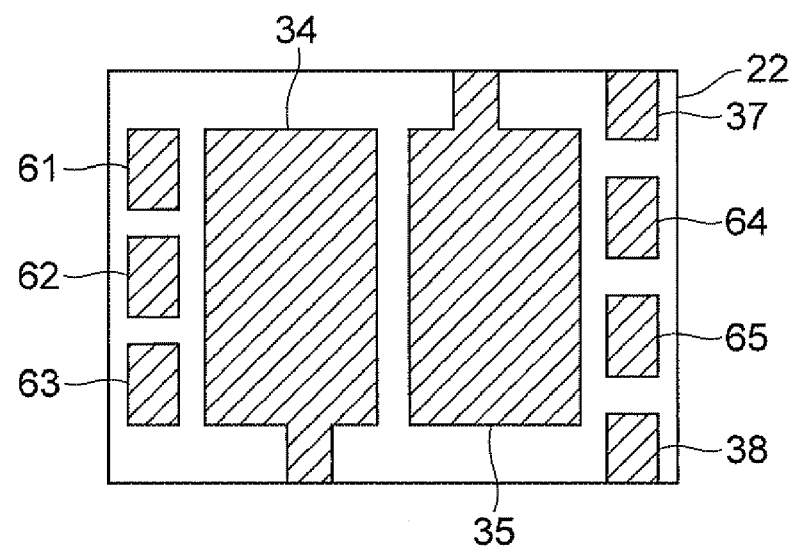

Fig.22
(a)
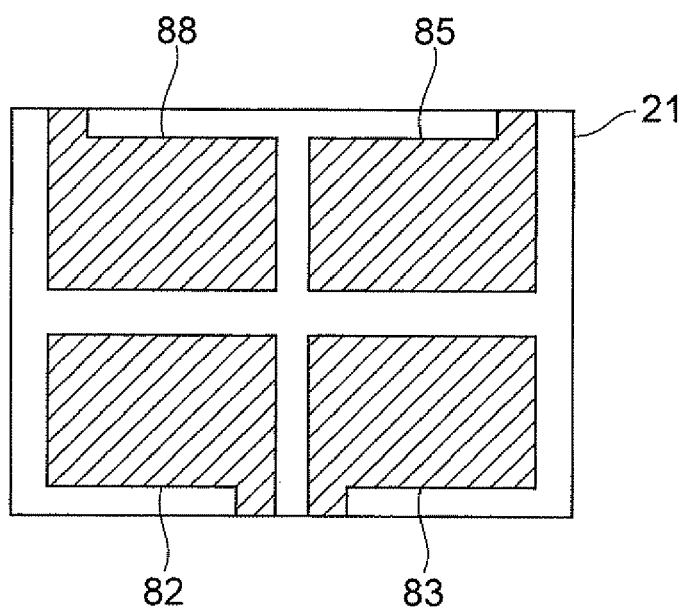
(b)
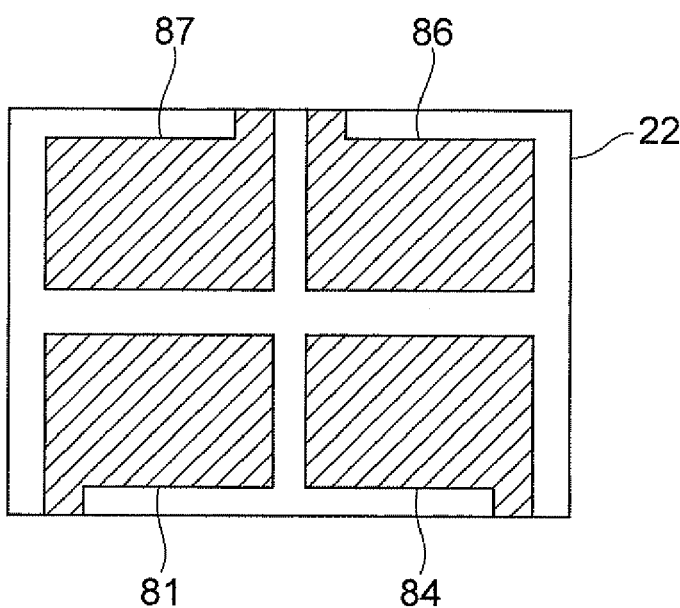

Fig.23
(a)
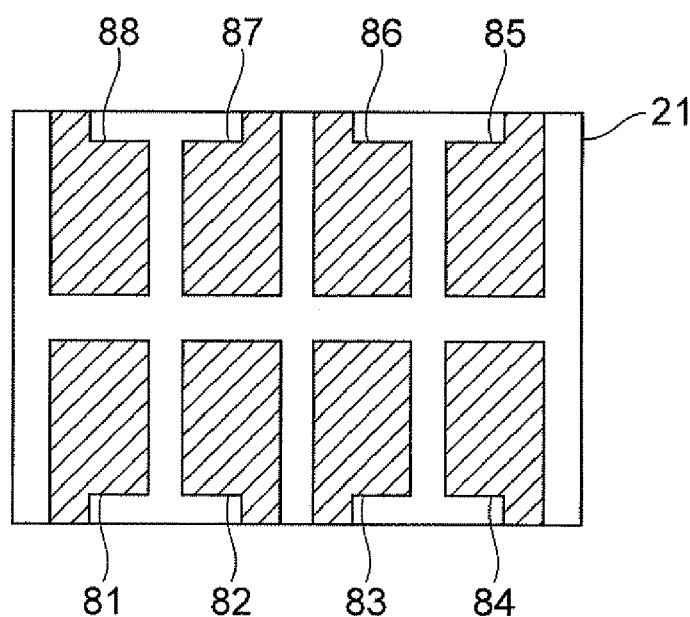
(b)
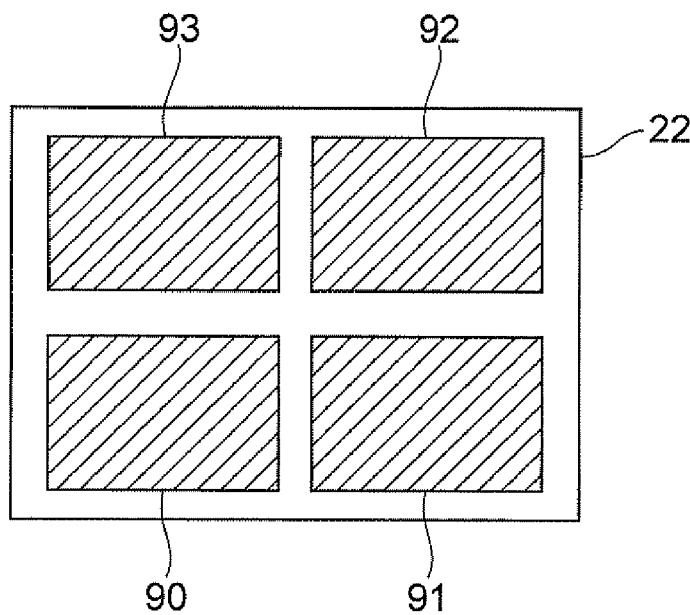

METHOD OF MOUNTING CAPACITOR ARRAY

BACKGROUND OF THE INVENTION

1. Field of the Invention

The present invention relates to a mounting method for mounting a capacitor array having at least three capacitor sections.

2. Related Background Art

As a multiple multilayer capacitor array having three or more capacitor sections, a quadruple multilayer capacitor array in which four capacitor sections are arranged in a row in a single element body has been known, for example, as disclosed in Japanese Patent Application Laid-Open Publication No. 2000-277380.

Meanwhile, two kinds of noise, i.e., differential-mode noise (normal-mode noise) and common-mode noise, have been known to occur in power lines and the like. Conventionally, for eliminating these two kinds of noise, techniques different from each other have been taken respectively, or multilayer capacitor arrays specially designed for removing the two kinds of noise have been used. Hence, no mounting method has been provided for eliminating these two kinds of noise in power lines by a simple technique such as use of a typical multilayer capacitor array. Also, no mounting method has been provided which can construct various equivalent circuits while eliminating the two kinds of noise by a simple technique such as use of a typical multilayer capacitor array.

SUMMARY OF THE INVENTION

It is an object of the present invention to provide a method of mounting a capacitor array which can easily eliminate two kinds of noise composed of differential-mode noise and common-mode noise by using a single element and construct various equivalent circuits.

The capacitor array mounting method in accordance with the present invention is a method of mounting a capacitor array comprising at least first, second, and third capacitor sections onto a circuit board formed with a first lead connecting power lines to each other and a second lead for grounding. This mounting method mounts the capacitor array onto the circuit board by connecting the capacitor array to the first and second leads by using at least one of a first connection method of connecting such that the first and second capacitor sections are parallel to each other while the third capacitor section is in series with the parallel first and second capacitor sections; a second connection method of connecting such that the first, second, and third capacitor sections are in series in sequence; and a third connection method of connecting such that the first and second capacitor sections are in series with each other without using the third capacitor section. In the first connection method, one end of each of the first and second capacitor sections on a side unconnected to the third capacitor section is connected to the first lead while the other end of each of the first and second capacitor sections on a side connected to the third capacitor section is connected to the second lead, and one end of the third capacitor section on a side unconnected to the first and second capacitor sections is connected to the first lead while the other end of the third capacitor section on a side connected to the first and second capacitor sections is connected to the second lead. In the second connection method, one end of the first capacitor section on a side unconnected to the second capacitor section is connected to the first lead while one end of the second capacitor section on a side connected to the third capacitor section is connected to the second lead, and one end of the third capacitor section on the side unconnected to the second capacitor section is connected to the first lead while the other end of the third capacitor section on a side connected to the second capacitor section is connected to the second lead. In the third connection method, one end of the first capacitor section on the side unconnected to the second capacitor section is connected to the first lead while the other end of the first capacitor section on the side connected to the second capacitor section is connected to the second lead, and one end of the second capacitor section on a side unconnected to the first capacitor section is connected to the first lead while the other end of the second capacitor section on a side connected to the first capacitor section is connected to the second lead.

In the capacitor array mounting method in accordance with the present invention, the first, second, and third capacitor sections function both as a capacitor for eliminating differential-mode noise and a capacitor for eliminating common-mode noise when the capacitor array is connected to the first and second leads by using the first or second connection method, while the first and second capacitor sections function both as a capacitor for eliminating differential-mode noise and a capacitor for eliminating common-mode noise when the capacitor array is connected to the first and second leads by using the third connection method. Therefore, employing one of the first to third connection methods can easily eliminate two kinds of noise composed of differential-mode noise and common-mode noise by using a single element. Also, since one connection method (e.g., a connection method constituted by a parallel circuit, a series circuit, or the like) can selectively be used among the first to third connection methods and so forth, various equivalent circuits can be constructed according to the structure of the circuit board to mount. For example, in the case where the first and second capacitor sections have respective capacitances different from each other when using the first connection method in which the first and second capacitor sections form a parallel circuit, two self-resonant frequencies can be provided, so that low impedance can be obtained in a wide band, thus making it possible to yield a circuit structure which can eliminate high-frequency noise in the wide band. Here, connecting an end part of a capacitor section to the first or second lead encompasses not only direct connection, but also indirect connection through other capacitor sections and the like.

Preferably, in the capacitor array mounting method, the capacitor array is a multilayer capacitor array comprising a capacitor element body having first, second, third, fourth, fifth, and sixth inner electrodes; a first terminal electrode disposed on an outer surface of the capacitor element body and connected to the first inner electrode; a second terminal electrode disposed on the outer surface of the capacitor element body and connected to the second inner electrode; a third terminal electrode disposed on the outer surface of the capacitor element body and connected to the third inner electrode; a fourth terminal electrode disposed on the outer surface of the capacitor element body and connected to the fourth inner electrode; a fifth terminal electrode disposed on the outer surface of the capacitor element body and connected to the fifth inner electrode; and a sixth terminal electrode disposed on the outer surface of the capacitor element body and connected to the sixth inner electrode. In this capacitor array, the first and second inner electrodes form the first capacitor section, the third and fourth inner electrodes form the second capacitor section, and the fifth and sixth inner electrodes form the third capacitor section.

Preferably, the first connection method mounts the capacitor array onto the circuit board by connecting the capacitor array to the first and second leads such that one of the first and second terminal electrodes and one of the third and fourth terminal electrodes are connected to the first lead while the other of the first and second terminal electrodes and the other of the third and fourth terminal electrodes are connected to the second lead, and one of the fifth and sixth terminal electrodes is connected to the first lead while the other of the fifth and sixth terminal electrodes is connected to the second lead. Preferably, the second connection method mounts the capacitor array onto the circuit board by connecting the capacitor array to the first and second leads such that one of the first and second terminal electrodes is connected to the first lead while one of the third and fourth terminal electrodes is connected to the second lead, and one of the fifth and sixth terminal electrodes is connected to the first lead while the other of the fifth and sixth terminal electrodes is connected to the second lead. Preferably, the third connection method mounts the capacitor array onto the circuit board by connecting the capacitor array to the first and second leads such that one of the first and second terminal electrodes is connected to the first lead while the other of the first and second terminal electrodes is connected to the second lead, and one of the third and fourth terminal electrodes is connected to the first lead while the other of the third and fourth terminal electrodes is connected to the second lead. These reliably make it possible to easily eliminate two kinds of noise composed of differential-mode noise and common-mode noise by using any of the first to third connection methods.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

[FIG. 11] is a diagram illustrating another example of inner electrodes in the multilayer capacitor array in accordance with the first embodiment;

[FIG. 12] is a diagram illustrating still another example of inner electrodes in the multilayer capacitor array in accordance with the first embodiment;

[FIG. 13] is a diagram illustrating still another example of inner electrodes in the multilayer capacitor array in accordance with the first embodiment;

[FIG. 14] is a diagram illustrating still another example of inner electrodes in the multilayer capacitor array in accordance with the first embodiment;

[FIG. 22] is a diagram illustrating another example of inner electrodes in the multilayer capacitor array in accordance with the second embodiment; and

[FIG. 23] is a diagram illustrating still another example of inner electrodes in the multilayer capacitor array in accordance with the second embodiment.

DESCRIPTION OF THE PREFERRED EMBODIMENTS

In the following, preferred embodiments of the present invention will be explained in detail with reference to the accompanying drawings. In the explanation, the same constituents or those having the same functions will be referred to with the same signs, while omitting their overlapping descriptions.

First Embodiment

Figure 1:
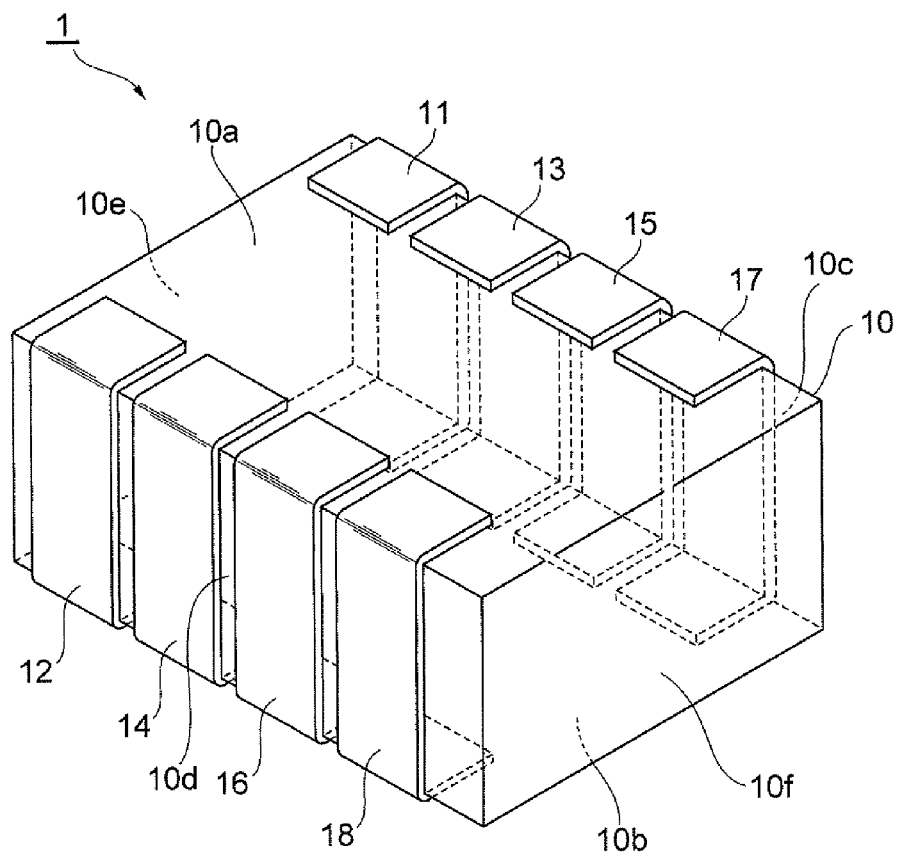
[FIG. 1] is a perspective view of a multilayer capacitor array in accordance with a first embodiment.

To begin with, a multilayer capacitor array 1 in accordance with the first embodiment will be explained with reference to FIGS. 1 and 2. As illustrated in FIG. 1, the multilayer capacitor array 1 is a quadruple capacitor array comprising a capacitor element body 10 having a rectangular parallelepiped form and terminal electrodes 11, 12, 13, 14, 15, 16, 17, 18 arranged on the outer surface of the capacitor element body 10. The capacitor element body 10 includes first and second main faces 10a, 10b opposing each other; first and second side faces 10c, 10d opposing each other and extending along longer-side directions of the first and second main faces 10a, 10b; and third and fourth side faces 10e, 10f opposing each other and extending along shorter-side directions of the first and second main faces 10a, 10b. The first and second side faces 10c, 10d and third and fourth side faces 10e, 10f extend such as to connect the first and second main faces 10a, 10b to each other.

The first, third, fifth, and seventh terminal electrodes 11, 13, 15, 17 are disposed on the first side face 10e of the capacitor element body 10. The first, third, fifth, and seventh terminal electrodes 11, 13, 15, 17 are located in this order in the direction from the third side face 10e to the fourth side face 10f. The second, fourth, sixth, and eighth terminal electrodes 12, 14, 16, 18 are disposed on the second side face 10d of the capacitor element body 10. The second, fourth, sixth, and eighth terminal electrodes 12, 14, 16, 18 are located in this order in the direction from the third side face 10e to the fourth side face 10f. The first, third, fifth, and seventh terminal electrodes 11, 13, 15, 17 oppose the second, fourth, sixth, and eighth terminal electrodes 12, 14, 16, 18, respectively, in a direction in which the first and second side faces 10c, 10d oppose each other.

The first to eighth terminal electrodes 11 to 18 are formed, for example, by applying and burning a conductive paste containing a conductive metal powder and glass frit onto the outer surface of the capacitor element body 10. Plating layers may be formed on the burned electrodes when necessary. Other terminal electrodes which will be explained later are formed similarly.

Figure 2:
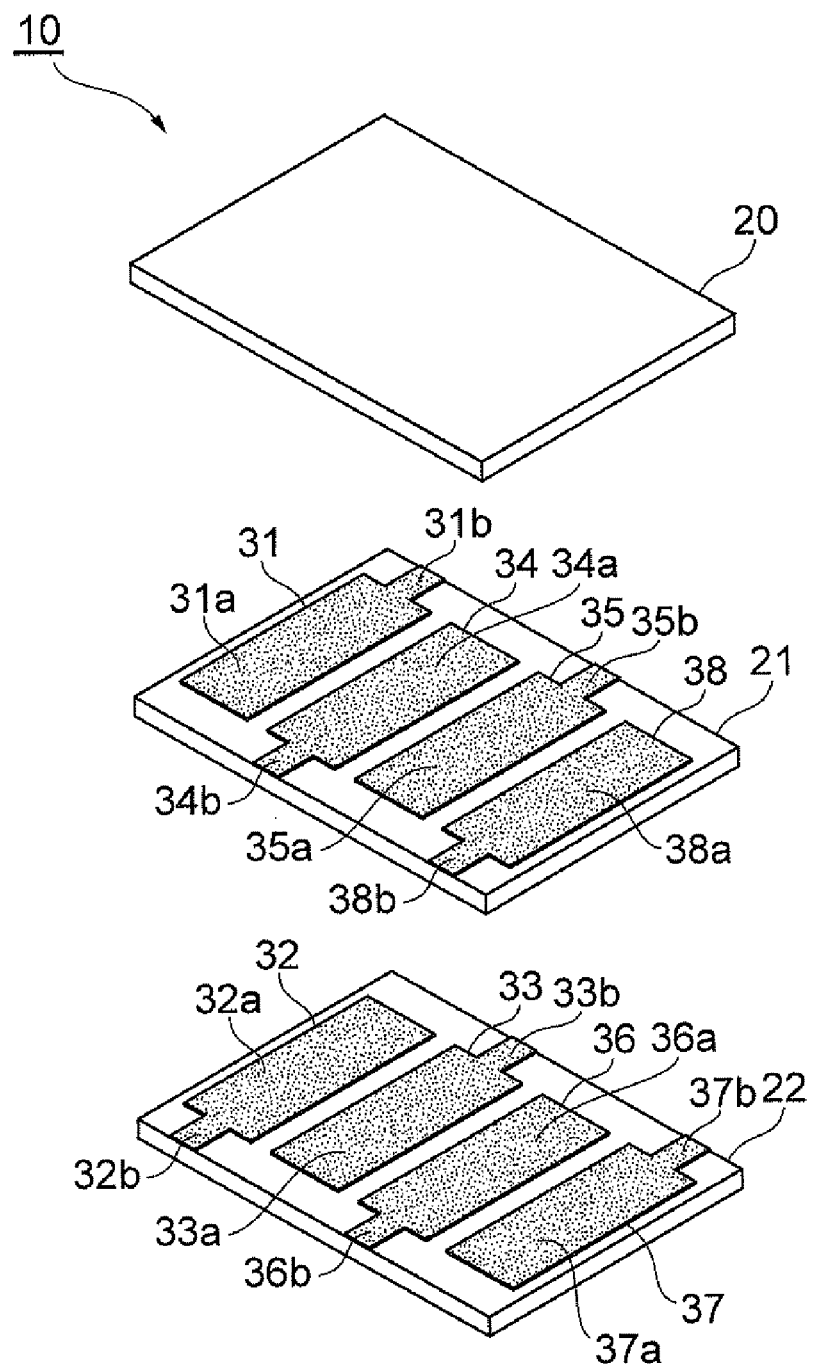
[FIG. 2] is an exploded perspective view of a capacitor element body included in the multilayer capacitor array in accordance with the first embodiment.

As illustrated in FIG. 2, the capacitor element body 10 has insulator layers 20, 21, 22 and inner electrodes 31 to 38. The insulator layers 20 to 22 extend in directions parallel to the first and second main faces 10a, 10b and are laminated in the direction in which the first and second main faces 10a, 10b oppose each other. That is, the direction in which the first and second main faces 10a, 10b oppose each other is the laminating direction of the insulator layers 20 to 22. Each of the insulator layers 20 to 22 is constituted by a sintered body of a ceramic green sheet containing a dielectric ceramic, for example. In the actual multilayer capacitor array 1, the insulator layers 20 to 22 are integrated to such an extent that their boundaries are indiscernible. Each of the inner electrodes 31 to 38 is constituted by a sintered body of a conductive paste. Other inner electrodes which will be explained later are formed similarly.

Figure 3:
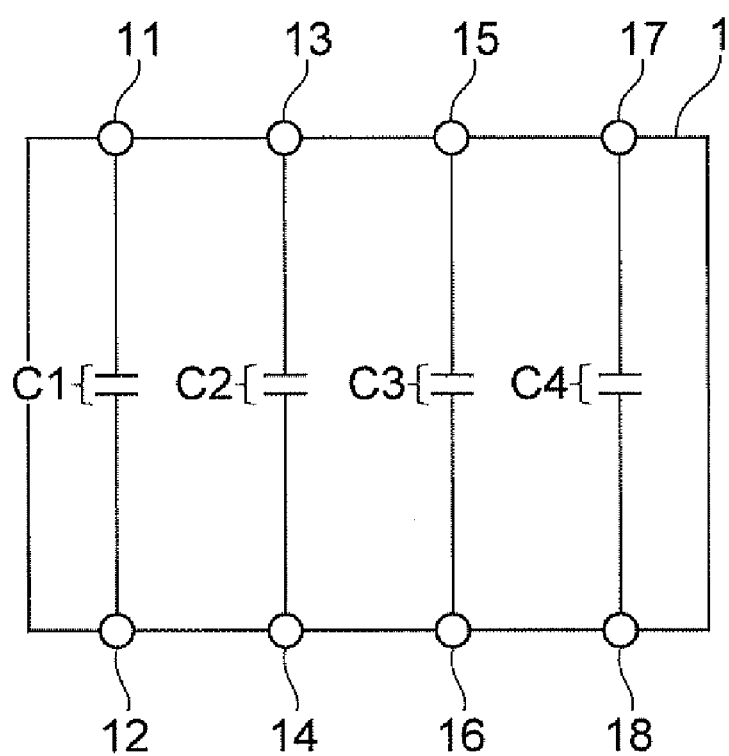
[FIG. 3] is an equivalent circuit diagram of the multilayer capacitor array in accordance with the first embodiment.

The first and second inner electrodes 31, 32 are arranged such as to oppose each other through the insulator layer 21 interposed therebetween, and form a first capacitor section C1 (see FIG. 3). The third and fourth inner electrodes 33, 34 are arranged such as to oppose each other through the insulator layer 21 interposed therebetween, and form a second capacitor section C2. The fifth and sixth inner electrodes 35, 36 are arranged such as to oppose each other through the insulator layer 21 interposed therebetween, and form a third capacitor section C3. The seventh and eighth inner electrodes 37, 38 are arranged such as to oppose each other through the insulator layer 21 interposed therebetween, and form a fourth capacitor section C4. This embodiment is set such that the first and fourth capacitor sections C1, C4 have the same capacitance, while the second and third capacitor sections C2, C3 have the same capacitance, so as to make it unnecessary to take account of the mounting direction at the time of mounting, testing, and so forth of the multilayer capacitor array 1. While the first and fourth capacitor sections C1, C4 are set to a capacitance different from and smaller than that of the second and third capacitor sections C2, C3 in order to eliminate high-frequency noise in a wide band in the first connection method that will be explained later, the capacitance of the first and fourth capacitor sections C1, C4 may be set identical to or greater than that of the second and third capacitor sections C2, C3 as a matter of course.

The first, fourth, fifth, and eighth inner electrodes 31, 34, 35, 38 are formed on the insulator layer 21. The first, fourth, fifth, and eighth inner electrodes 31, 34, 35, 38 are arranged in a row at predetermined intervals such as to be electrically insulated from each other in the direction in which the third and fourth side faces 10e, 10f oppose each other. The second, third, sixth, and seventh inner electrodes 32, 33, 36, 37 are formed on the insulator layer 22. The second, third, sixth, and seventh inner electrodes 32, 33, 36, 37 are arranged in a row at predetermined intervals such as to be electrically insulated from each other in the direction in which the third and fourth side faces 10e, 10f oppose each other.

The first inner electrode 31 includes a rectangular main electrode part 31a and a lead part 31b extending from the main electrode part 31a such as to reach the first side face 10c. The second inner electrode 32 includes a rectangular main electrode part 32a and a lead part 32b extending from the main electrode part 32a such as to reach the second side face 10d. The main electrode parts 31a, 32a oppose each other over substantially the whole surface through the insulator layer 21 in the laminating direction. The lead part 31b is drawn to the first side face 10c and connected to the first terminal electrode 11 electrically and physically. The lead part 32b is drawn to the second side face 10d and connected to the second terminal electrode 12 electrically and physically.

The third inner electrode 33 includes a rectangular main electrode part 33a and a lead part 33b extending from the main electrode part 33a such as to reach the first side face 10c. The fourth inner electrode 34 includes a rectangular main electrode part 34a and a lead part 34b extending from the main electrode part 34a such as to reach the second side face 10d. The main electrode parts 33a, 34a oppose each other over substantially the whole surface through the insulator layer 21 in the laminating direction. The lead part 33b is drawn to the first side face 10c and connected to the third terminal electrode 13 electrically and physically. The lead part 34b is drawn to the second side face 10d and connected to the fourth terminal electrode 14 electrically and physically.

The fifth inner electrode 35 includes a rectangular main electrode part 35a and a lead part 35b extending from the main electrode part 35a such as to reach the first side face 10c. The sixth inner electrode 36 includes a rectangular main electrode part 36a and a lead part 36b extending from the main electrode part 36a such as to reach the second side face 10d. The main electrode parts 35a, 36a oppose each other over substantially the whole surface through the insulator layer 21 in the laminating direction. The lead part 35b is drawn to the first side face 10c and connected to the fifth terminal electrode 15 electrically and physically. The lead part 36b is drawn to the second side face 10d and connected to the sixth terminal electrode 16 electrically and physically.

The seventh inner electrode 37 includes a rectangular main electrode part 37a and a lead part 37b extending from the main electrode part 37a such as to reach the first side face 10c. The eighth inner electrode 38 includes a rectangular main electrode part 38a and a lead part 38b extending from the main electrode part 38a such as to reach the second side face 10d. The main electrode parts 37a, 38a oppose each other over substantially the whole surface through the insulator layer 21 in the laminating direction. The lead part 37b is drawn to the first side face 10c and connected to the seventh terminal electrode 17 electrically and physically. The lead part 38b is drawn to the second side face 10d and connected to the eighth terminal electrode 18 electrically and physically. The multilayer capacitor array 1 having such a structure is represented by the equivalent circuit diagram illustrated in FIG. 3.

Figure 4:
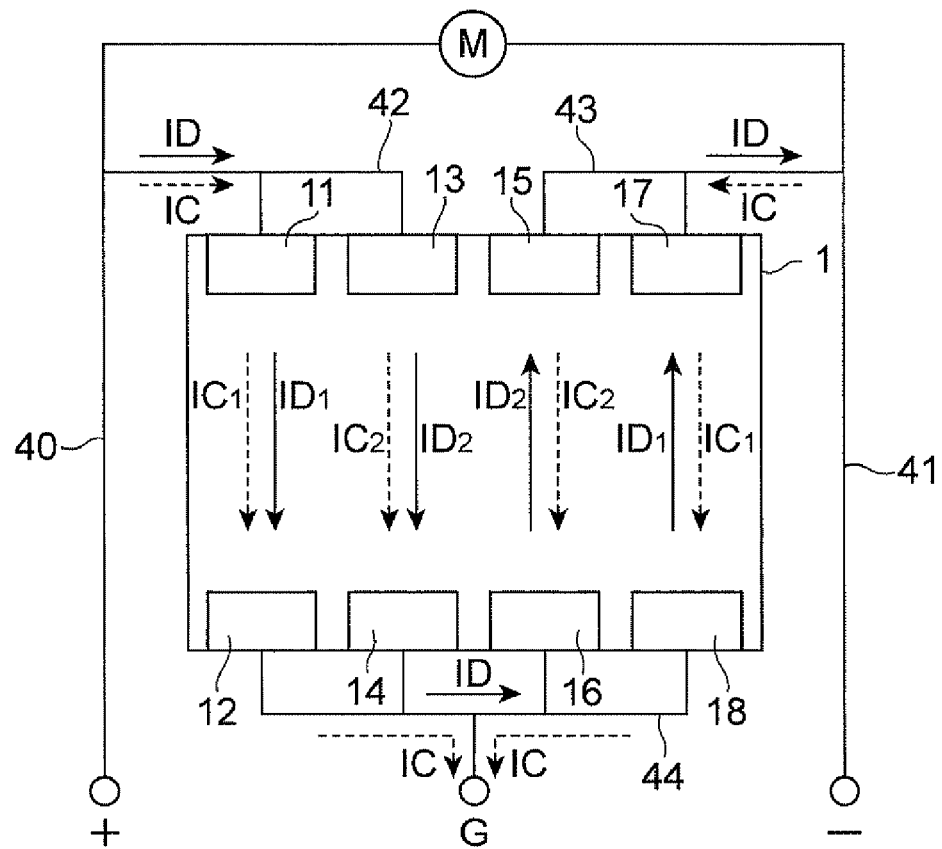
[FIG. 4] is a diagram illustrating an example in which the multilayer capacitor array in accordance with the first embodiment is mounted to a circuit board by the first connection method.

The first, second, and third connection methods for mounting the multilayer capacitor array 1 equipped with the first, second, third, and fourth capacitor sections C1 to C4 onto a circuit board formed with first leads 42, 43 connecting power lines 40, 41 to each other and a second lead 44 for grounding will now be explained (see FIG. 4 and the like). This embodiment mounts the multilayer capacitor array 1 onto the circuit board by connecting the above-mentioned multilayer capacitor array 1 to the first and second leads 42 to 44 by using one of the first to third connection methods explained in the following.

To begin with, the first connection method will be explained. As illustrated in FIG. 4, the first connection method connects the first and third terminal electrodes 11, 13, which are respective one ends of the first and second capacitor sections C1, C2, to the first lead 42, and the second and fourth terminal electrodes 12, 14, which are the respective other ends of the first and second capacitor sections C1, C2, to the second lead 44. The second and fourth terminal electrodes 12, 14 are connected to the sixth and eighth terminal electrodes 16, 18 of the third and fourth capacitor sections C3, C4 through the second lead 44. The fifth and seventh terminal electrodes 15, 17, which are respective one ends of the third and fourth capacitor sections C3, C4, are connected to the first lead 43, while the sixth and eighth terminal electrodes 16, 18, which are the respective other ends of the third and fourth capacitor sections C3, C4, are connected to the second lead 44. Here, the first and third terminal electrodes 11, 13 are end parts on the side unconnected to the third and fourth capacitor sections C3, C4, while the fifth and seventh terminal electrodes 15, 17 are end parts on the side unconnected to the first and second capacitor sections C1, C2.

Figure 5:
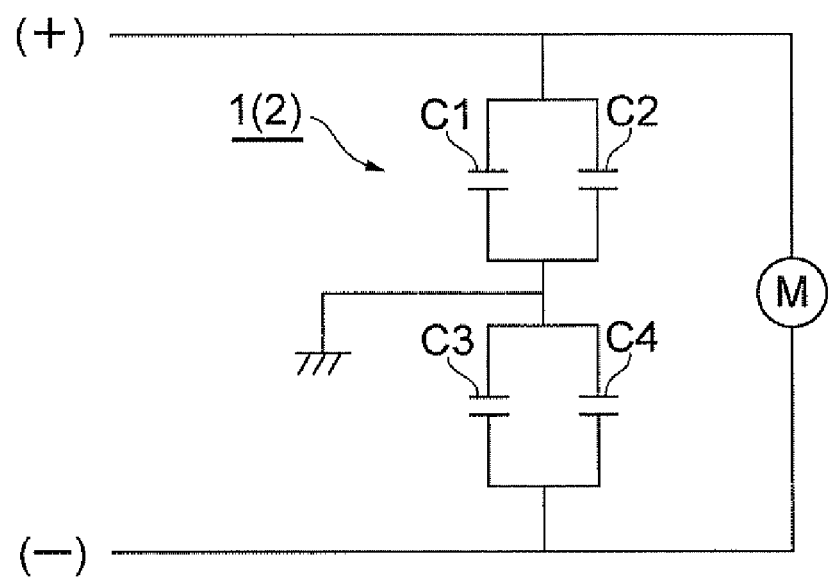
[FIG. 5] is an equivalent circuit diagram in the case where the multilayer capacitor array is mounted to the circuit board as illustrated in FIG. 4.

Such a mounting method connects the first, third, fifth, and seventh terminal electrodes 11, 13, 15, 17 disposed on the same side face 10c to the first leads 42, 43 connecting the power lines 40, 41 to each other, and the second, fourth, sixth, and eighth terminal electrodes 12, 14, 16, 18 disposed on the same side face 10d to the second lead 44 for grounding. Thus, as illustrated in the equivalent circuit diagram of FIG. 5, the multilayer capacitor array 1 is connected to the leads 42 to 44 such that the first and second capacitor sections C1, C2 are parallel to each other, the third and fourth capacitor sections C3, C4 are parallel to each other, and the third and fourth capacitor sections C3, C4 are in series with the parallel first and second capacitor sections C1, C2, and the multilayer capacitor array 1 is further mounted in parallel with the device M.

In the differential mode in the multilayer capacitor array 1 mounted as mentioned above, as illustrated in FIG. 4, a current $ID_1$ flows through the first capacitor section C1 from the first terminal electrode 11 to the second terminal electrode 12 while a current $ID_2$ flows through the second capacitor section C2 from the third terminal electrode 13 to the fourth terminal electrode 14, and the current $ID_2$ flows through the third capacitor section C3 from the sixth terminal electrode 16 to the fifth terminal electrode 15 while the current $ID_1$ flows through the fourth capacitor section C4 from the eighth terminal electrode 18 to the seventh terminal electrode 17.

In the common mode, on the other hand, a current $IC_1$ flows through the first capacitor section C1 from the first terminal electrode 11 to the second terminal electrode 12 while a current $IC_2$ flows through the second capacitor section C2 from the third terminal electrode 13 to the fourth terminal electrode 14, and the current $IC_2$ flows through the third capacitor section C3 from the fifth terminal electrode 15 to the sixth terminal electrode 16 while the current $IC_1$ flows through the fourth capacitor section C4 from the seventh terminal electrode 17 to the eighth terminal electrode 18. Here, the currents $ID_1$ and $ID_2$ are those obtained by dividing a current ID in a predetermined ratio, while the currents $IC_1$ and $IC_2$ are those obtained by dividing a current IC in a predetermined ratio. Therefore, the first to fourth capacitor sections C1 to C4 function both as a capacitor for eliminating differential-mode noise and a capacitor for eliminating common-mode noise.

Figure 6:
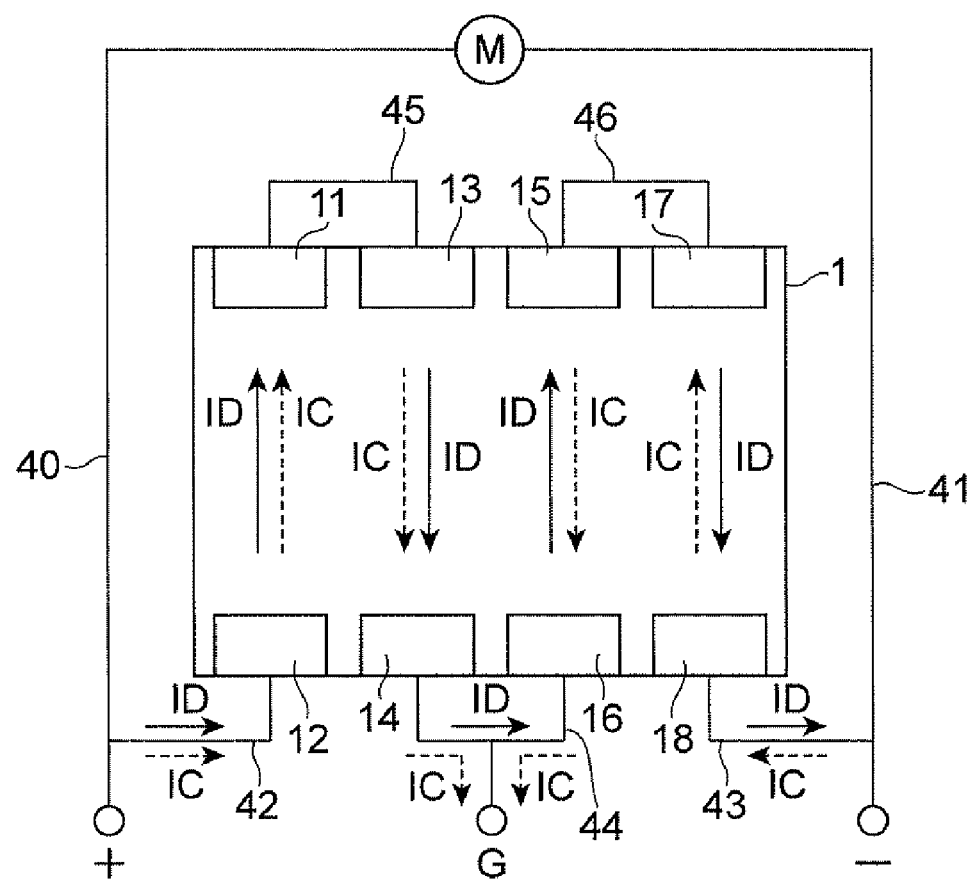
[FIG. 6] is a diagram illustrating an example in which the multilayer capacitor array in accordance with the first embodiment is mounted to a circuit board by the second connection method.

The second connection method will now be explained. In the second connection method, as illustrated in FIG. 6, the second terminal electrode 12, which is one end of the first capacitor section C1, is connected to the first lead 42, the first terminal electrode 11, which is the other end of the first capacitor section C1, is connected to the third terminal electrode 13 of the second capacitor section C2 through a third lead 45, and the fourth terminal electrode 14, which is one end of the second capacitor section C2, is connected to the second lead 44. The fourth terminal electrode 14 is connected to the sixth terminal electrode 16 of the third capacitor section C3 through the second lead 44. The eighth terminal electrode 18, which is one end of the fourth capacitor section C4, is connected to the first lead 43, the seventh terminal electrode 17, which is the other end of the fourth capacitor section C4, is connected to the fifth terminal electrode 15, which is one end of the third capacitor section C3, through a fourth lead 46, and the sixth terminal electrode 16, which is the other end of the third capacitor section C3, is connected to the second lead 44. The second terminal electrode 12 serves as an end part on the side unconnected to the second capacitor section C2, while the fifth terminal electrode 15 acts as an end part on the side unconnected to the second capacitor section C2 and is connected to the first lead 43 through the fourth capacitor section C4.

Figure 7:
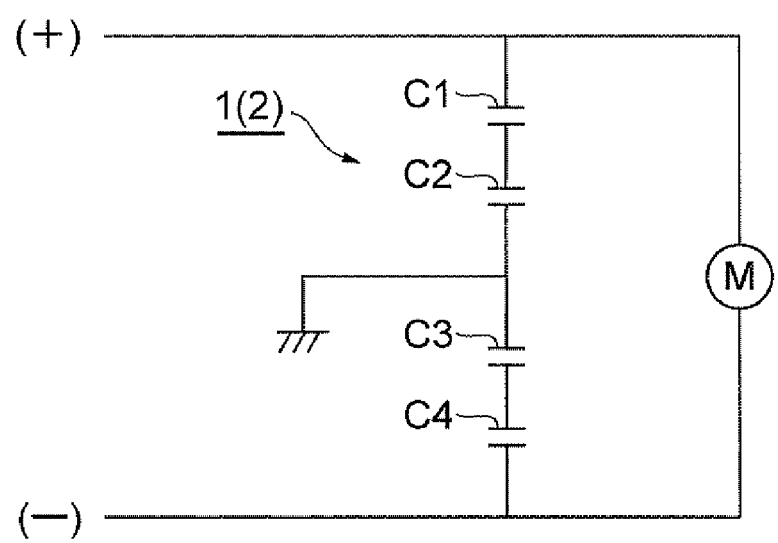
[FIG. 7] is an equivalent circuit diagram in the case where the multilayer capacitor array is mounted to the circuit board as illustrated in FIG. 6.

Such a mounting method connects the second and eighth terminal electrodes 12, 18 to the first leads 42, 43 connecting the power lines 40, 41 to each other, and the fourth and sixth terminal electrodes 14, 16 to the second lead 44. Thus, as illustrated in the equivalent circuit diagram of FIG. 7, the multilayer capacitor array 1 is connected to the leads 42 to 44 such that the first to fourth capacitor sections C1 to C4 are connected in series in sequence, while the junction between the second and third capacitor sections C2, C3 is grounded, and the multilayer capacitor array 1 is further mounted in parallel with the device M.

In the differential mode in the multilayer capacitor array 1 mounted as mentioned above, as illustrated in FIG. 6, a current ID flows through the first capacitor section C1 from the second terminal electrode 12 to the first terminal electrode 11 and through the second capacitor section C2 from the third terminal electrode 13 to the fourth terminal electrode 14. The current ID also flows through the third capacitor section C3 from the sixth terminal electrode 16 to the fifth terminal electrode 15 and through the fourth capacitor section C4 from the seventh terminal electrode 17 to the eighth terminal electrode 18.

In the common mode, on the other hand, a current IC flows through the first capacitor section C1 from the second terminal electrode 12 to the first terminal electrode 11 and through the second capacitor section C2 from the third terminal electrode 13 to the fourth terminal electrode 14. The current IC also flows through the fourth capacitor section C4 from the eighth terminal electrode 18 to the seventh terminal electrode 17 and through the third capacitor section C3 from the fifth terminal electrode 15 to the sixth terminal electrode 16. Therefore, the first to fourth capacitor sections C1 to C4 function both as a capacitor for eliminating differential-mode noise and a capacitor for eliminating common-mode noise.

Figure 8:
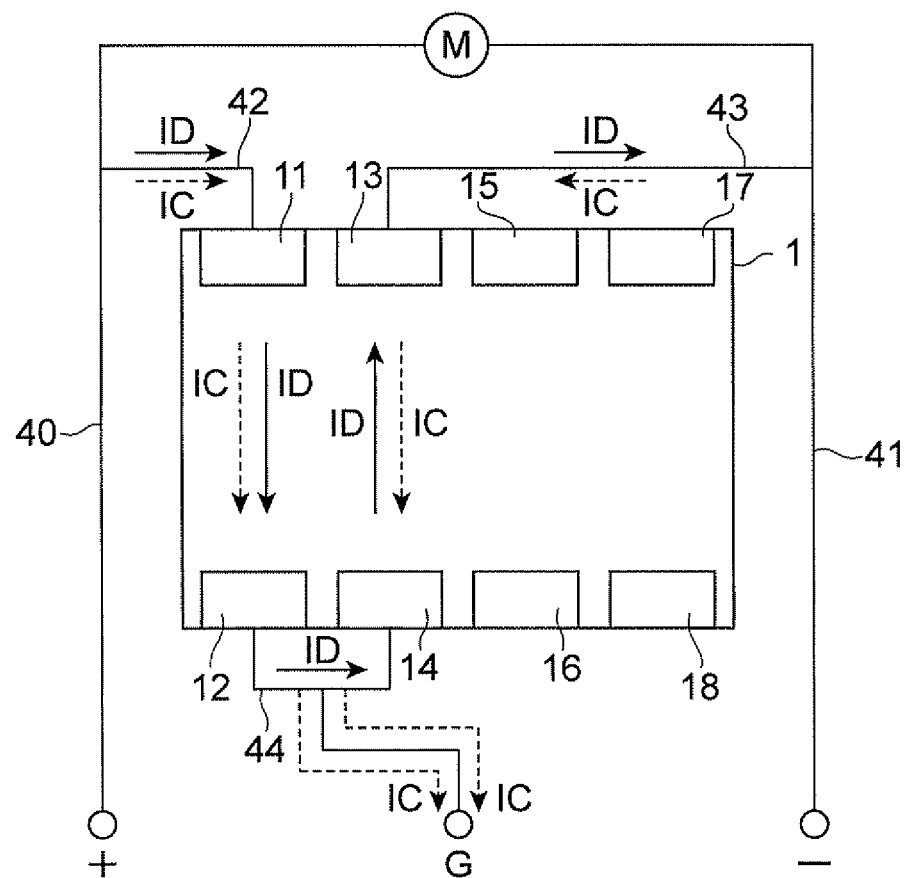
[FIG. 8] is a diagram illustrating an example in which the multilayer capacitor array in accordance with the first embodiment is mounted to a circuit board by the third connection method.

The third connection method will now be explained. In the third connection method, as illustrated in FIG. 8, the first terminal electrode 11, which is one end of the first capacitor section C1, is connected to the first lead 42, while the second terminal electrode 12, which is the other end of the first capacitor section C1, is connected to the second lead 44. The second terminal electrode 12 is connected to the fourth terminal electrode 14 of the second capacitor section C2 through the second lead 44. The third terminal electrode 13, which is one end of the second capacitor section C2, is connected to the first lead 43, while the fourth terminal electrode 14, which is the other end of the second capacitor section C2, is connected to the second lead 44. The first terminal electrode 11 serves as an end part on the side unconnected to the second capacitor section C2, while the third terminal electrode 13 acts as an end part on the side unconnected to the first capacitor section C1. The third connection method mounts the multilayer capacitor army 1 onto the circuit board without using the third and fourth capacitor sections C3, C4.

Figure 9:
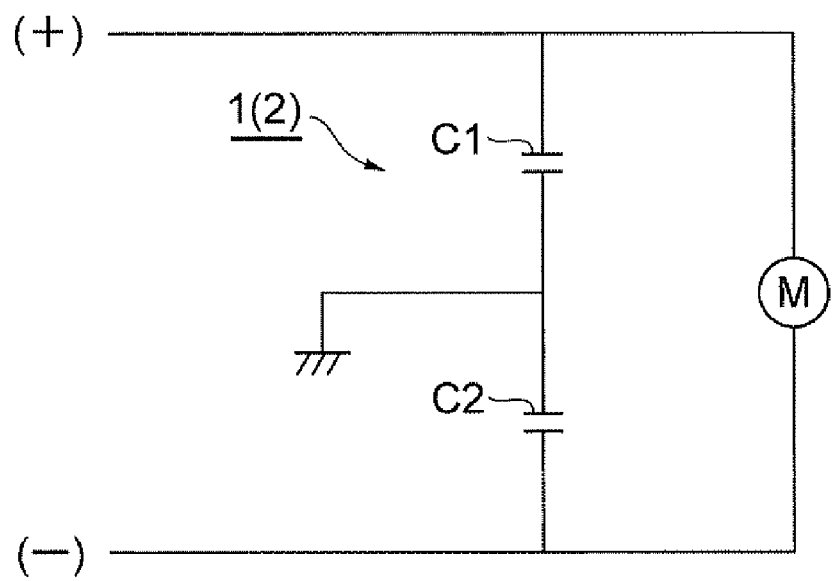
[FIG. 9] is an equivalent circuit diagram in the case where the multilayer capacitor array is mounted to the circuit board as illustrated in FIG. 8.

Such a mounting method connects the first and third terminal electrodes 11, 13 to the first leads 42, 43 connecting the power lines 40, 41 to each other, and the second and fourth terminal electrodes 12, 14 to the second lead 44 for grounding. Thus, as illustrated in the equivalent circuit diagram of FIG. 9, the multilayer capacitor array 1 is connected to the leads 42 to 44 such that the first and second capacitor sections C1, C2 are connected in series in sequence, while the junction between the first and second capacitor sections C1, C2 is grounded, and the multilayer capacitor array 1 is further mounted in parallel with the device M.

In the differential mode in the multilayer capacitor array 1 mounted as mentioned above, as illustrated in FIG. 8, a current ID flows through the first capacitor section C1 from the first terminal electrode 11 to the second terminal electrode 12 and through the second capacitor section C2 from the fourth terminal electrode 14 to the third terminal electrode 13. In the common mode, on the other hand, a current IC flows through the first capacitor section C1 from the first terminal electrode 11 to the second terminal electrode 12 and through the second capacitor section C2 from the third terminal electrode 13 to the fourth terminal electrode 14. Therefore, the first and second capacitor sections C1, C2 function both as a capacitor for eliminating differential-mode noise and a capacitor for eliminating common-mode noise.

Figure 10:
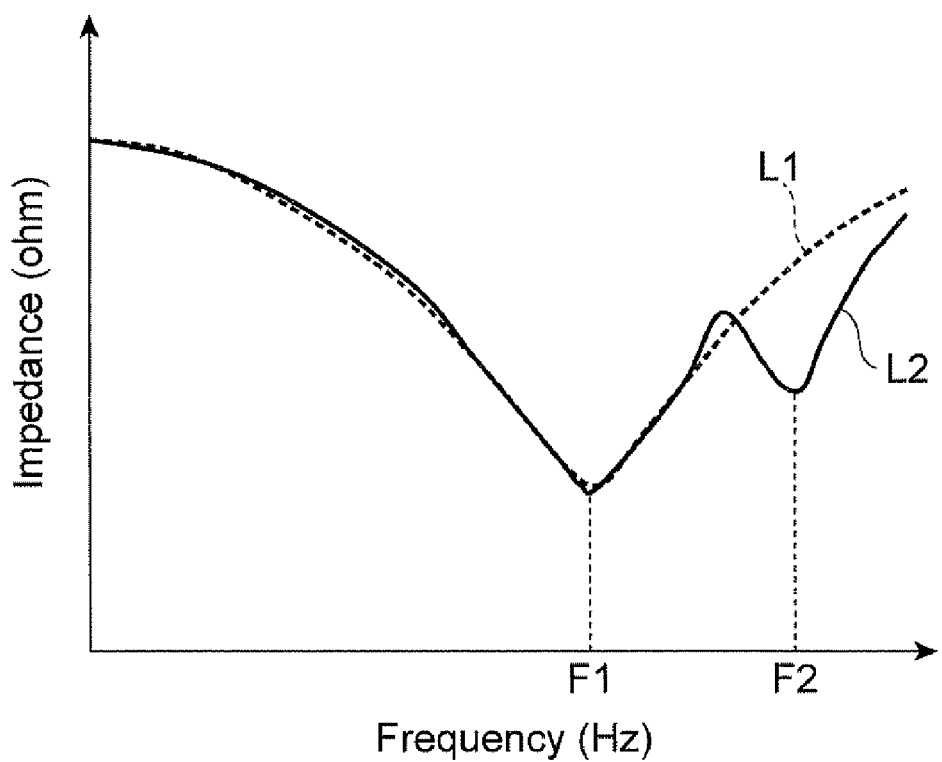
[FIG. 10] is a chart illustrating an example of noise elimination in a wide band by the multilayer capacitor array mounting method illustrated in FIG. 4.

When the capacitor array mounting method in accordance with this embodiment connects the multilayer capacitor array 1 to the first and second leads 42 to 44 by using the first or second connection method, the first, second, third, and fourth capacitor sections C1, C2, C3, C4 function both as a capacitor for eliminating differential-mode noise and a capacitor for eliminating common-mode noise as in the foregoing. When the capacitor array mounting method connects the capacitor array to the first and second leads 42 to 44 by using the third connection method, the first and second capacitor sections C1, C2 function both as a capacitor for eliminating differential-mode noise and a capacitor for eliminating common-mode noise. Therefore, employing one of the first to third connection methods can easily eliminate two kinds of noise composed of differential-mode noise and common-mode noise by using a single element. Also, since one connection method (e.g., a connection method constituted by a parallel circuit, a series circuit, or the like) can selectively be used among the first to third connection methods and so forth, various equivalent circuits can be constructed according to the structure of the circuit board to mount. For example, in the case where the first and second capacitor sections C1, C2 have respective capacitances different from each other when using the first connection method in which the first and second capacitor sections C1, C2 form a parallel circuit, a circuit structure having two self-resonant frequencies can be obtained. That is, while a capacitor array in which capacitor sections having different capacitances are not connected in parallel can have only one self-resonant frequency F1 as illustrated by dotted curve L1 in FIG. 10, this mounting method enables such a circuit design as to have two self-resonant frequencies F1, F2 as illustrated by solid curve L2 in FIG. 10. Employing such a circuit design can achieve low impedance in a wide band, thus allowing the multilayer capacitor array 1 to eliminate high-frequency noise in the wide band.

A modified example of the inner electrodes 31 to 38 used in the multilayer capacitor array 1 in accordance with the first embodiment includes those having structures illustrated in (a) and (b) of FIG. 11. The modified example illustrated in FIG. 11 is constructed such that the first, third, fifth, and seventh inner electrodes 31, 33, 35, 37 are formed on the insulator layer 21, while the second, fourth, sixth, and eighth inner electrodes 32, 34, 36, 38 are formed on the insulator layer 22. The rest of the structure is the same as that mentioned above, which will also hold in the following modified examples.

Another modified example of the inner electrodes 31 to 38 includes those having structures illustrated in (a) and (b) of FIG. 12. The modified example illustrated in FIG. 12 is constructed such that the first, fourth, fifth, and eighth inner electrodes 31, 34, 35, 38 are formed on the insulator layer 21, while the second, third, sixth, and seventh inner electrodes 32, 33, 36, 37 are formed on the insulator layer 22. In this modified example, the inner electrodes 33 to 36 have an area smaller than that of the inner electrodes 31, 32, 37, 38, the main electrode parts 33a, 34a of the third and fourth inner electrodes 33, 34 forming the second capacitor section C2 partly oppose each other through the insulator layer 21 in the laminating direction, and the main electrode parts 35a, 36a of the fifth and sixth inner electrodes 35, 36 forming the third capacitor section C3 partly oppose each other through the insulator layer 21 in the laminating direction. Therefore, the second and third capacitor sections C2, C3 have a capacitance smaller than that of the first and fourth capacitor sections C1, C4.

Still another modified example of the inner electrodes 31 to 38 includes inner electrodes 31 to 38, 50 to 55 having structures illustrated in (a) and (b) of FIG. 13. The modified example illustrated in FIG. 13 is constructed such that the first, third to sixth, and seventh inner electrodes 31, 33 to 36, 38 and inner electrodes 50, 51 are formed on the insulator layer 21, while the second and seventh inner electrodes 32, 37 and inner electrodes 52 to 55 are formed on the insulator layer 22. In this modified example, the second capacitor section C2 is constituted by a plurality of capacitor parts formed by the inner electrodes 33, 52, 50, 53, 34, while the third capacitor section C3 is constituted by a plurality of capacitor parts formed by the inner electrodes 35, 54, 51, 55, 36. Thus making the second and third capacitor sections C2, C3 as assemblies of capacitor parts having a smaller capacitance can shift the resonant frequency to the higher frequency side.

Still another modified example of the inner electrodes 31 to 38 includes inner electrodes 31 to 38, 56 to 65 having structures illustrated in (a) and (b) of FIG. 14. The modified example illustrated in FIG. 14 is constructed such that the first to third and sixth inner electrodes 31, 32, 33, 36 and inner electrodes 56 to 60 are formed on the insulator layer 21, while the fourth, fifth, seventh, and eighth inner electrodes 34, 35, 37, 38 and inner electrodes 61 to 65 are formed on the insulator layer 22. In this modified example, the first capacitor section C1 is constituted by a plurality of capacitor parts formed by the inner electrodes 31, 61, 56, 62, 57, 63, 32, while the fourth capacitor section C4 is constituted by a plurality of capacitor parts formed by the inner electrodes 37, 58, 64, 59, 65, 60, 38. Thus employing assemblies of capacitor parts having a smaller capacitance can shift the resonant frequency to the higher frequency side.

Second Embodiment

Figure 15:
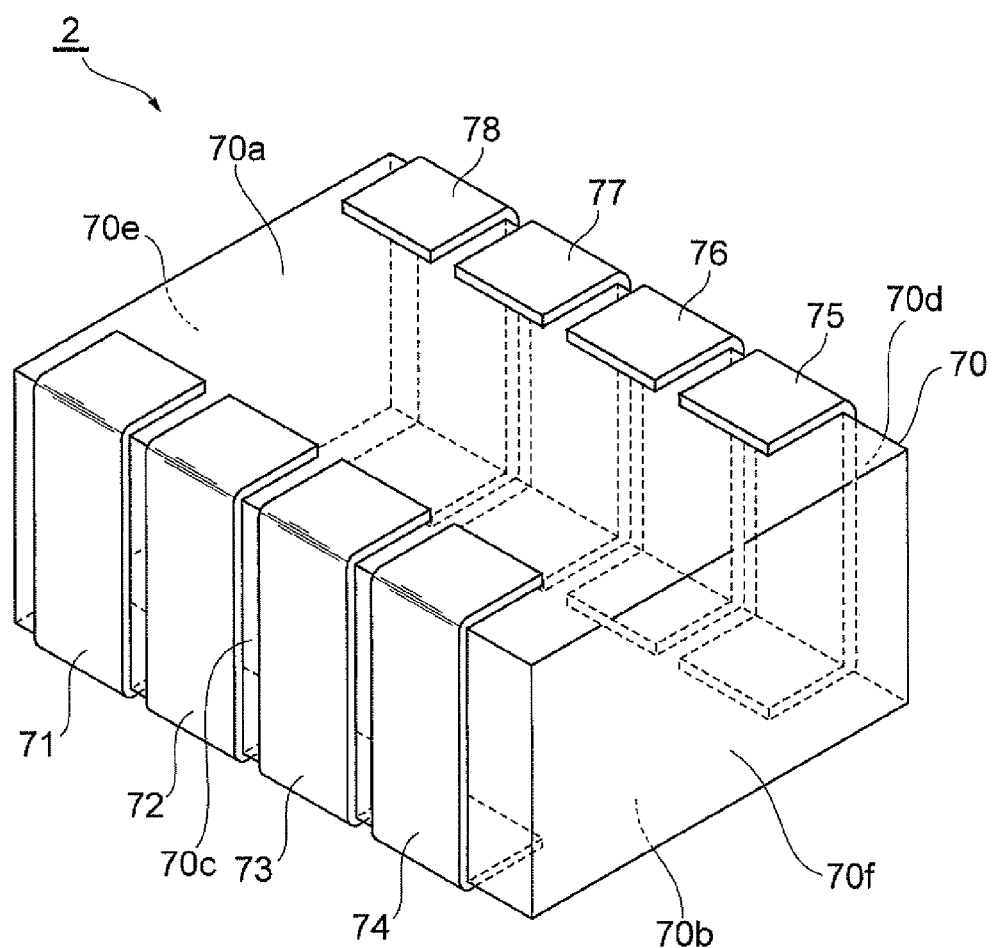
[FIG. 15] is a perspective view of a multilayer capacitor array in accordance with a second embodiment.

The structure of a multilayer capacitor array 2 in accordance with the second embodiment will now be explained with reference to FIGS. 15 and 16. As illustrated in FIG. 15, the multilayer capacitor array 2 is a quadruple capacitor array comprising a capacitor element body 70 having a rectangular parallelepiped form and terminal electrodes 71 to 78 arranged on the outer surface of the capacitor element body 70 as in the first embodiment. The capacitor element body 70 includes first and second main faces 70a, 70b; first and second side faces 70c, 70d; and third and fourth side faces 70e, 70f.

The first, second, third, and fourth terminal electrodes 71, 72, 73, 74 are disposed on the side face 70c of the capacitor element body 70 (on the depicted front side). The first, second, third, and fourth terminal electrodes 71, 72, 73, 74 are located in this order in the direction from the third side face 70e to the fourth side face 70f. The fifth, sixth, seventh, and eighth terminal electrodes 75, 76, 77, 78 are disposed on the second side face 70d of the capacitor element body 70 (on the depicted rear side). The fifth, sixth, seventh, and eighth terminal electrodes 75, 76, 77, 78 are located in the order of the eighth terminal electrode 78, seventh terminal electrode 77, sixth terminal electrode 76, and fifth terminal electrode 75 in the direction from the third side face 70e to the fourth side face 70f. The first, second, third, and fourth terminal electrodes 71, 72, 73, 74 oppose the eighth, seventh, sixth, and fifth terminal electrodes 78, 77, 76, 75, respectively, in the direction in which the first and second side faces 70c, 70d oppose each other.

Figure 16:
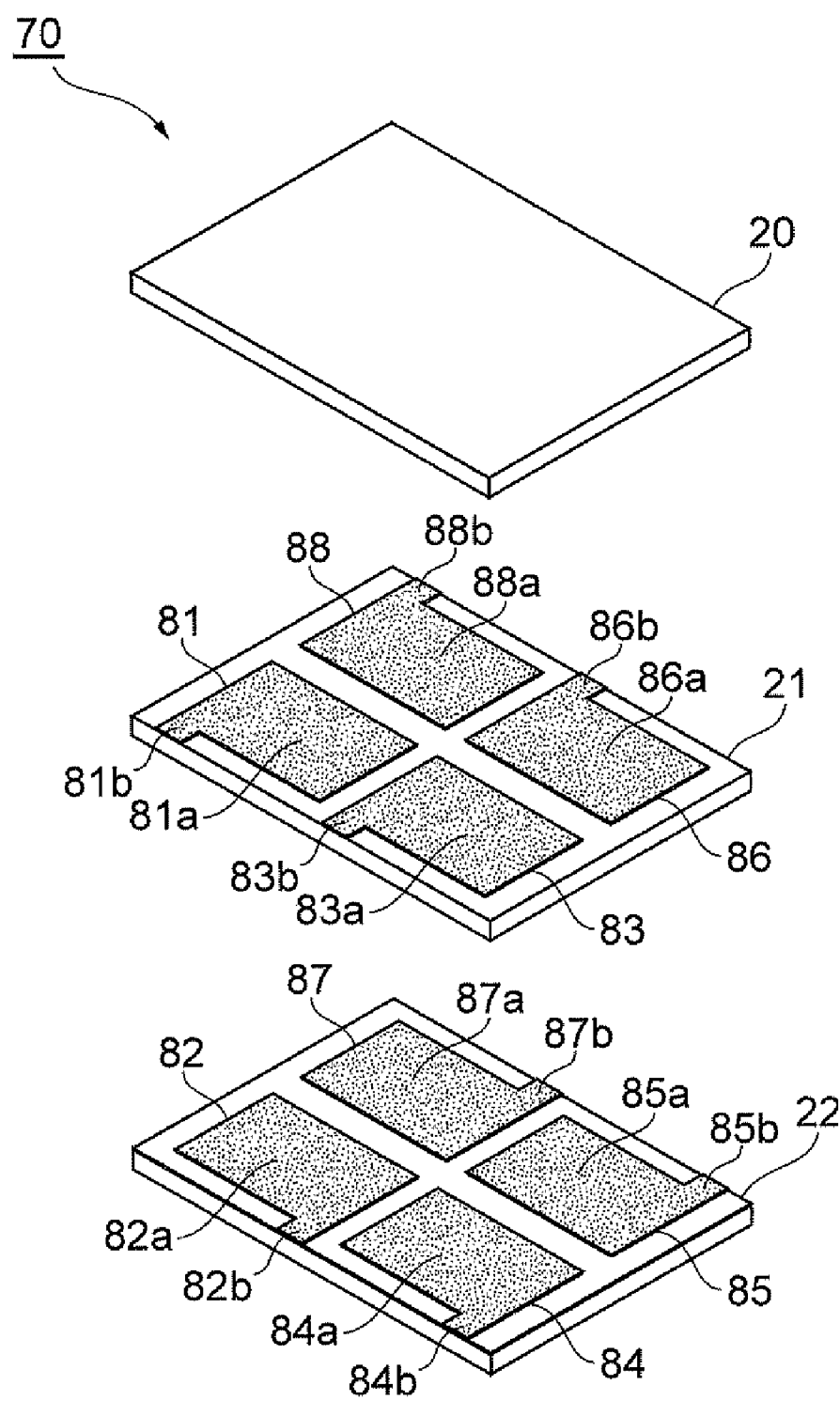
[FIG. 16] is an exploded perspective view of a capacitor element body included in the multilayer capacitor array in accordance with the second embodiment.
Figure 17:
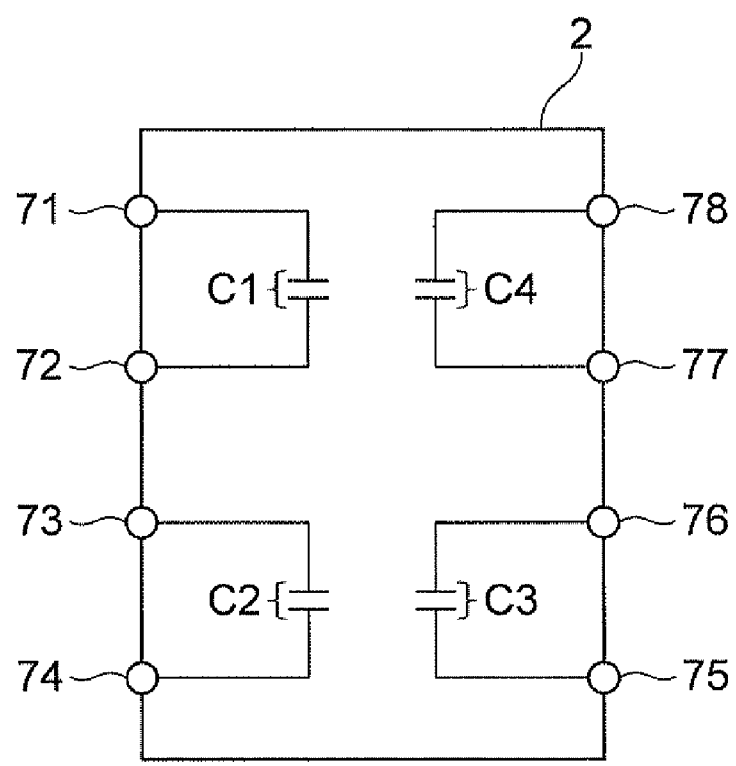
[FIG. 17] is an equivalent circuit diagram of the multilayer capacitor array in accordance with the second embodiment.

As illustrated in FIG. 16, the capacitor element body 70 has insulator layers 20, 21, 22 and inner electrodes 81 to 88. The first and second inner electrodes 81, 82 are arranged such as to oppose each other through the insulator layer 21 interposed therebetween, and form a first capacitor section C1 (see FIG. 17). The third and fourth inner electrodes 83, 84 are arranged such as to oppose each other through the insulator layer 21 interposed therebetween, and form a second capacitor section C2. The fifth and sixth inner electrodes 85, 86 are arranged such as to oppose each other through the insulator layer 21 interposed therebetween, and form a third capacitor section C3. The seventh and eighth inner electrodes 87, 88 are arranged such as to oppose each other through the insulator layer 21 interposed therebetween, and form a fourth capacitor section C4.

The first, third, sixth, and eighth inner electrodes 81, 83, 86, 88 are formed on the insulator layer 21. The first, third, sixth, and eighth inner electrodes 81, 83, 86, 88 are electrically insulated from each other. The second, fourth, fifth, and seventh inner electrodes 82, 84, 85, 87 are formed on the insulator layer 22. The second, fourth, fifth, and seventh inner electrodes 82, 84, 85, 87 are electrically insulated from each other.

The first inner electrode 81 includes a rectangular main electrode part 81a and a lead part 81b extending from the main electrode part 81a such as to reach the first side face 70c. The second inner electrode 82 includes a rectangular main electrode part 82a and a lead part 82b extending from the main electrode part 82a such as to reach the first side face 70c. The main electrode parts 81a, 82a oppose each other over substantially the whole surface through the insulator layer 21 in the laminating direction. The lead parts 81b, 82b are drawn to the first side face 70c, so as to be connected electrically and physically to the first and second terminal electrodes 71, 72, respectively.

The third inner electrode 83 includes a rectangular main electrode part 83a and a lead part 83b extending from the main electrode part 83a such as to reach the first side face 70c. The fourth inner electrode 84 includes a rectangular main electrode part 84a and a lead part 84b extending from the main electrode part 84a such as to reach the first side face 70c. The main electrode parts 83a, 84a oppose each other over substantially the whole surface through the insulator layer 21 in the laminating direction. The lead parts 83b, 84b are drawn to the first side face 70c, so as to be connected electrically and physically to the third and fourth terminal electrodes 73, 74, respectively.

The fifth inner electrode 85 includes a rectangular main electrode part 85a and a lead part 85b extending from the main electrode part 85a such as to reach the second side face 70d. The sixth inner electrode 86 includes a rectangular main electrode part 86a and a lead part 86b extending from the main electrode part 86a such as to reach the second side face 70d. The main electrode parts 85a, 86a oppose each other over substantially the whole surface through the insulator layer 21 in the laminating direction. The lead parts 85b, 86b are drawn to the second side face 70d, so as to be connected electrically and physically to the fifth and sixth terminal electrodes 75, 76, respectively.

The seventh inner electrode 87 includes a rectangular main electrode part 87a and a lead part 87b extending from the main electrode part 87a such as to reach the second side face 70d. The eighth inner electrode 88 includes a rectangular main electrode part 88a and a lead part 88b extending from the main electrode part 88a such as to reach the second side face 70d. The main electrode parts 87a, 88a oppose each other over substantially the whole surface through the insulator layer 21 in the laminating direction. The lead parts 87b, 88b are drawn to the second side face 70d, so as to be connected electrically and physically to the seventh and eighth terminal electrodes 77, 78, respectively. The multilayer capacitor array 2 having such a structure is represented by the equivalent circuit diagram illustrated in FIG. 17.

Figure 18:
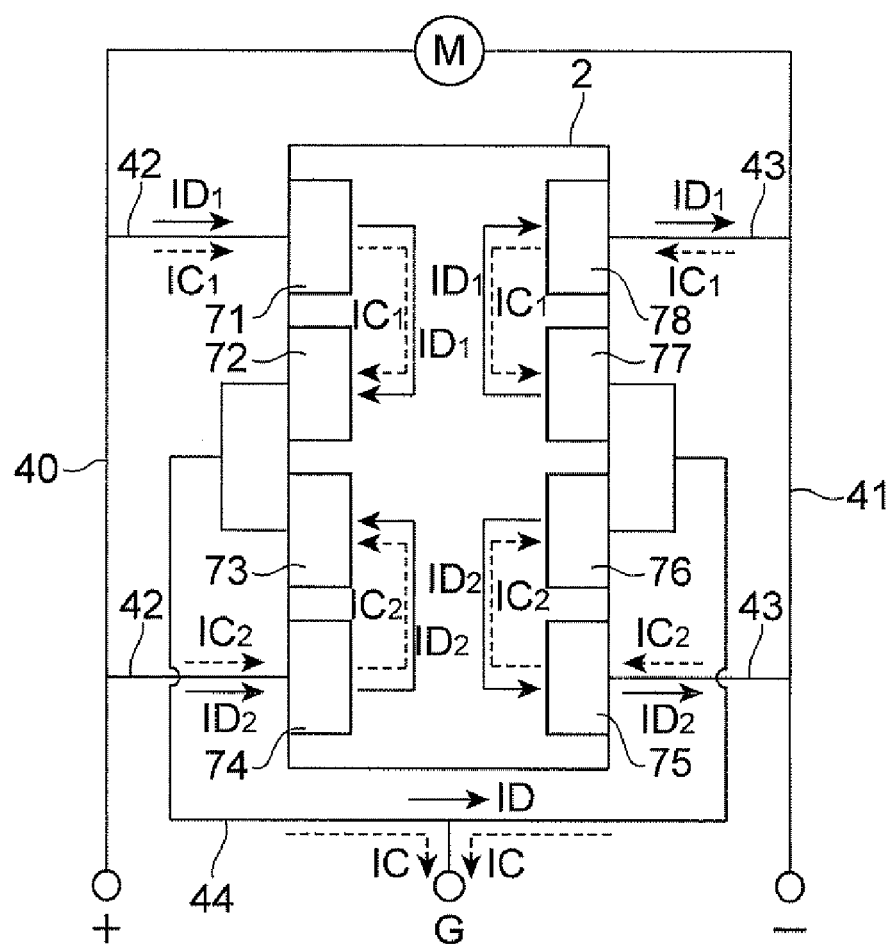
[FIG. 18] is a diagram illustrating an example in which the multilayer capacitor array in accordance with the second embodiment is mounted to a circuit board by the first connection method.

The first, second, and third connection methods for mounting the multilayer capacitor array 2 equipped with the first, second, third, and fourth capacitor sections C1 to C4 onto a circuit board formed with first leads 42, 43 connecting power lines 40, 41 to each other and a second lead 44 for grounding will now be explained (see FIG. 18 and the like). This embodiment mounts the multilayer capacitor array 2 onto the circuit board by connecting the above-mentioned multilayer capacitor array 2 to the first and second leads 42 to 44 by using one of the first to third connection methods explained in the following as with the first embodiment.

To begin with, the first connection method will be explained. As illustrated in FIG. 18, the first connection method connects the first and fourth terminal electrodes 71, 74, which are respective one ends of the first and second capacitor sections C1, C2, to the first lead 42, and the second and third terminal electrodes 72, 73, which are the other ends of the first and second capacitor sections C1, C2, to the second lead 44. The second and third terminal electrodes 72, 73 are connected to the sixth and seventh terminal electrodes 76, 77 of the third and fourth capacitor sections C3, C4 through the second lead 44. The fifth and eighth terminal electrodes 75, 78, which are respective one ends of the third and fourth capacitor sections C3, C4, are connected to the first lead 43, while the sixth and seventh terminal electrodes 16, 17, which are the other ends of the third and fourth capacitor sections C3, C4, are connected to the second lead 44. The first and fourth terminal electrodes 71, 74 serve as end parts on the side unconnected to the third and fourth capacitor sections C3, C4, while the fifth and eighth terminal electrodes 75, 78 act as end parts on the side unconnected to the first and second capacitor sections C1, C2.

Such a mounting method connects the first, fourth, fifth, and eighth terminal electrodes 71, 74, 75, 78 to the first leads 42, 43 connecting the power lines 40, 41 to each other, and the second, third, sixth, and seventh terminal electrodes 72, 73, 76, 77 to the second lead 44 for grounding. Thus, as illustrated in the equivalent circuit diagram of FIG. 5 as in the first embodiment, the multilayer capacitor array 2 is connected to the leads 42 to 44 such that the first and second capacitor sections C1, C2 are parallel to each other, the third and fourth capacitor sections C3, C4 are parallel to each other, and the third and fourth capacitor sections C3, C4 are in series with the parallel first and second capacitor sections C1, C2, and the multilayer capacitor array 2 is further mounted in parallel with the device M.

In the differential mode in the multilayer capacitor array 2 mounted as mentioned above, as illustrated in FIG. 18, a current $ID_1$ flows through the first capacitor section C1 from the first terminal electrode 71 to the second terminal electrode 72 while a current $ID_2$ flows through the second capacitor section C2 from the fourth terminal electrode 74 to the third terminal electrode 73, and the current $ID_2$ flows through the third capacitor section C3 from the sixth terminal electrode 76 to the fifth terminal electrode 75 while the current $ID_1$ flows through the fourth capacitor section C4 from the eighth seventh electrode 77 to the eighth terminal electrode 78.

Figure 19:
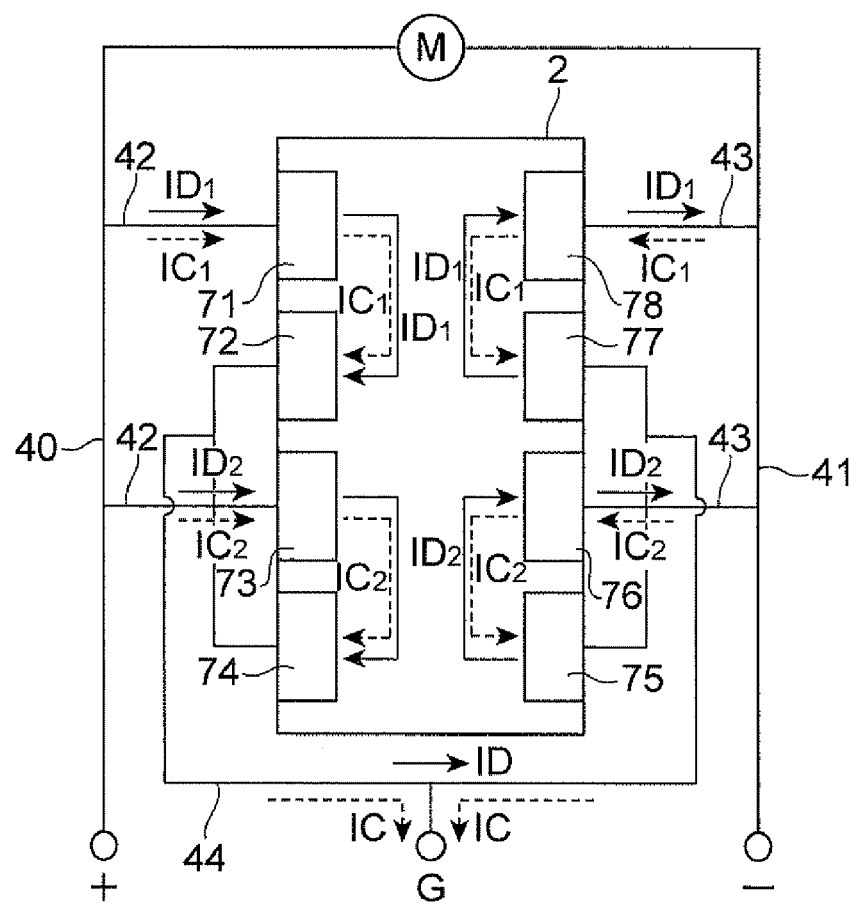
[FIG. 19] is a diagram illustrating another example in which the multilayer capacitor array in accordance with the second embodiment is mounted to a circuit board by the first connection method.

In the common mode, on the other hand, a current $IC_1$ flows through the first capacitor section C1 from the first terminal electrode 71 to the second terminal electrode 72 while a current $IC_2$ flows through the second capacitor section C2 from the fourth terminal electrode 74 to the third terminal electrode 73, and the current $IC_2$ flows through the third capacitor section C3 from the fifth terminal electrode 75 to the sixth terminal electrode 76 while the current $IC_1$ flows through the fourth capacitor section C4 from the eighth terminal electrode 78 to the seventh terminal electrode 77. Therefore, the first to fourth capacitor sections C1 to C4 function both as a capacitor for eliminating differential-mode noise and a capacitor for eliminating common-mode noise. In the first connection method, as illustrated in FIG. 19, the third and fourth terminal electrodes 73, 74 and fifth and sixth terminal electrodes 75, 76 may be connected to the leads 42 to 44 opposite to those mentioned above. This connection also allows the first to fourth capacitor sections C1 to C4 to function both as a capacitor for eliminating differential-mode noise and a capacitor for eliminating common-mode noise as mentioned above.

Figure 20:
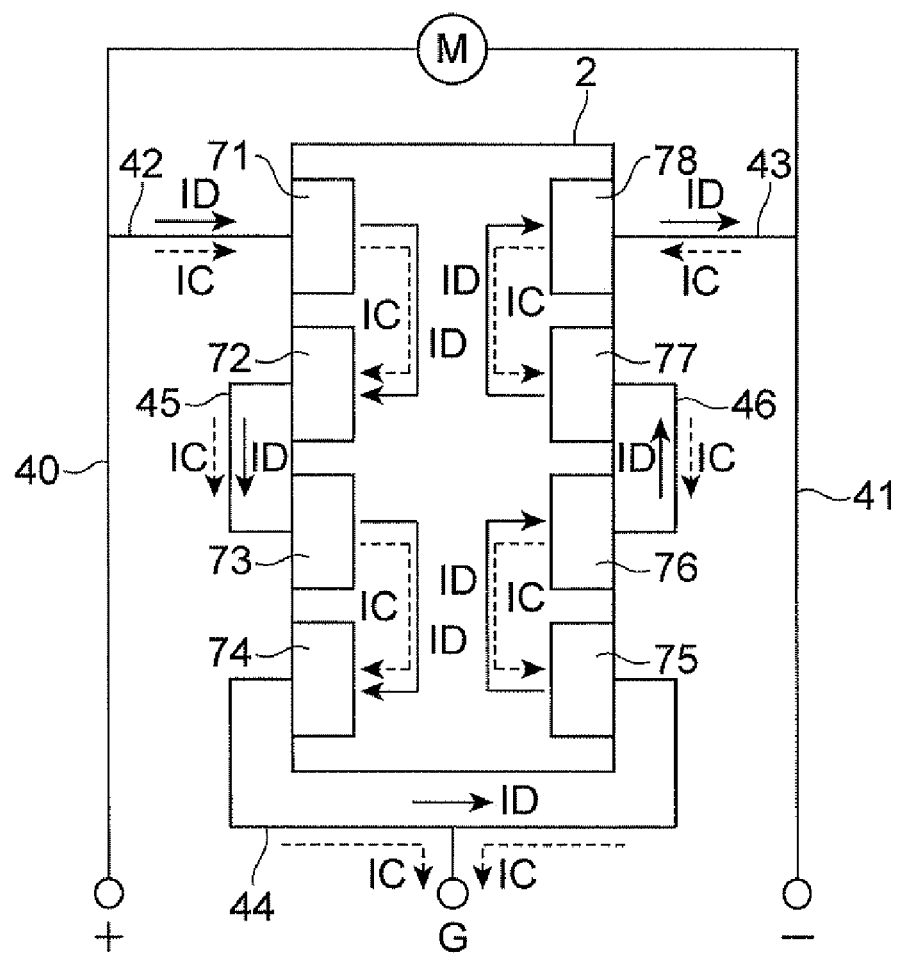
[FIG. 20] is a diagram illustrating an example in which the multilayer capacitor array in accordance with the second embodiment is mounted to a circuit board by the second connection method.

The second connection method will now be explained. As illustrated in FIG. 20, the second connection method connects the first terminal electrode 71, which is one end of the first capacitor section C1, to the first lead 42, the second terminal electrode 72, which is the other end of the first capacitor section C1, to the third terminal electrode 73 of the second capacitor section C2 through a third lead 45, and the fourth terminal electrode 74, which is one end of the second capacitor section C2, to the second lead 44. The fourth terminal electrode 74 is connected to the fifth terminal electrode 75 of the third capacitor section C3 through the second lead 44. The eighth terminal electrode 78, which is one end of the fourth capacitor section C4, is connected to the first lead 43, the seventh terminal electrode 77, which is the other end of the fourth capacitor section C4, is connected to the sixth terminal electrode 76, which is one end of the third capacitor section C3, through a fourth lead 46, and the fifth terminal electrode 75, which is the other end of the third capacitor section C3, is connected to the second lead 44. Here, the first terminal electrode 71 serves as an end part on the side unconnected to the second capacitor section C2, while the sixth terminal electrode 76 acts as an end part on the side unconnected to the second capacitor section C2 and is connected to the first lead 43 through the fourth capacitor section C4.

Such a mounting method connects the first and eighth terminal electrodes 71, 78 to the first leads 42, 43 connecting the power lines 40, 41 to each other, and the fourth and fifth terminal electrodes 74, 75 to the second lead 44. Thus, as illustrated in the equivalent circuit diagram of FIG. 7, the multilayer capacitor array 2 is connected to the leads 42 to 44 such that the first to fourth capacitor sections C1 to C4 are connected in series in sequence, while the junction between the second and third capacitor sections C2, C3 is grounded, and the multilayer capacitor array 2 is further mounted in parallel with the device M.

In the differential mode in the multilayer capacitor array 2 mounted as mentioned above, as illustrated in FIG. 20, a current ID flows through the first capacitor section C1 from the first terminal electrode 71 to the second terminal electrode 72 and through the second capacitor section C2 from the third terminal electrode 73 to the fourth terminal electrode 74. The current ID also flows through the third capacitor section C3 from the fifth terminal electrode 75 to the sixth terminal electrode 76 and through the fourth capacitor section C4 from the seventh terminal electrode 77 to the eighth terminal electrode 78.

In the common mode, on the other hand, a current IC flows through the first capacitor section C1 from the first terminal electrode 71 to the second terminal electrode 72 and through the second capacitor section C2 from the third terminal electrode 73 to the fourth terminal electrode 74. The current IC also flows through the fourth capacitor section C4 from the eighth terminal electrode 78 to the seventh terminal electrode 77 and through the third capacitor section C3 from the sixth terminal electrode 76 to the fifth terminal electrode 75. Therefore, the first to fourth capacitor sections C1 to C4 function both as a capacitor for eliminating differential-mode noise and a capacitor for eliminating common-mode noise.

Figure 21:
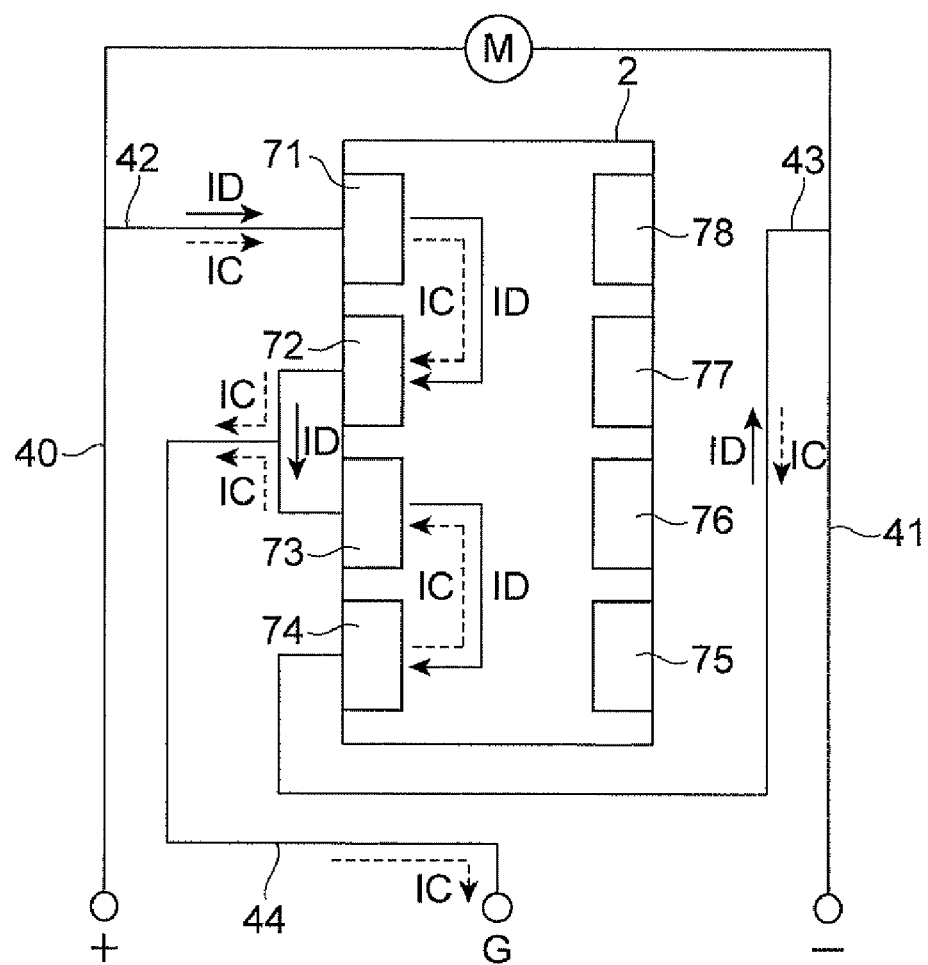
[FIG. 21] is a diagram illustrating an example in which the multilayer capacitor array in accordance with the second embodiment is mounted to a circuit board by the third connection method.

The third connection method will now be explained. In the third connection method, as illustrated in FIG. 21, the first terminal electrode 71, which is one end of the first capacitor section C1, is connected to the first lead 42, while the second terminal electrode 72, which is the other end of the first capacitor section C1, is connected to the second lead 44. The second terminal electrode 72 is connected to the third terminal electrode 73 of the second capacitor section C2 through the second lead 44. The fourth terminal electrode 74, which is one end of the second capacitor section C2, is connected to the first lead 43, while the third terminal electrode 73, which is the other end of the second capacitor section C2, is connected to the second lead 44. The first terminal electrode 71 serves as an end part on the side unconnected to the second capacitor section C2, while the fourth terminal electrode 74 acts as an end part on the side unconnected to the first capacitor section C1.

Such a mounting method connects the first and fourth terminal electrodes 71, 74 to the first leads 42, 43 connecting the power lines 40, 41 to each other, and the second and third terminal electrodes 72, 73 to the second lead 44 for grounding. Thus, as illustrated in the equivalent circuit diagram of FIG. 9, the multilayer capacitor array 2 is connected to the leads 42 to 44 such that the first and second capacitor sections C1, C2 are connected in series in sequence, while the junction between the first and second capacitor sections C1, C2 is grounded, and the multilayer capacitor array 2 is further mounted in parallel with the device M.

In the differential mode in the multilayer capacitor array 2 mounted as mentioned above, as illustrated in FIG. 21, a current ID flows through the first capacitor section C1 from the first terminal electrode 71 to the second terminal electrode 72 and through the second capacitor section C2 from the third terminal electrode 73 to the fourth terminal electrode 74. In the common mode, on the other hand, a current IC flows through the first capacitor section C1 from the first terminal electrode 71 to the second terminal electrode 72 and through the second capacitor section C2 from the fourth terminal electrode 74 to the third terminal electrode 73. Therefore, the first and second capacitor sections C1, C2 function both as a capacitor for eliminating differential-mode noise and a capacitor for eliminating common-mode noise.

As in the foregoing, by employing one of the first to third connection methods, the capacitor array mounting method in accordance with this embodiment can easily eliminate two kinds of noise composed of differential-mode noise and common-mode noise by using a single element as with the first embodiment. Also, since one connection method can selectively be used among the first to third connection methods and so forth, various equivalent circuits can be constructed according to the structure of the circuit board to mount.

A modified example of the inner electrodes 81 to 88 used in the multilayer capacitor array 2 in accordance with the second embodiment includes those having structures illustrated in (a) and (b) of FIG. 22. The modified example illustrated in FIG. 22 is constructed such that the second, third, fifth, and eighth inner electrodes 82, 83, 85, 88 are formed on the insulator layer 21, while the first, fourth, sixth, and seventh inner electrodes 81, 84, 86, 87 are formed on the insulator layer 22. The rest of the structure is the same as that mentioned above, which will also hold in the following modified example.

Another modified example of the inner electrodes 81 to 88 includes inner electrodes 81 to 88, 90 to 93 having structures illustrated in (a) and (b) of FIG. 23. The modified example illustrated in FIG. 23 is constructed such that the first to eighth inner electrodes 81 to 88 are formed on the insulator layer 21, while the inner electrodes 90 to 93 are formed on the insulator layer 22. In this modified example, the first capacitor section C1 is constituted by a plurality of capacitor parts formed by the inner electrodes 81, 90, 82, the second capacitor section C2 is constituted by a plurality of capacitor parts formed by the inner electrodes 83, 91, 84, the third capacitor section C3 is constituted by a plurality of capacitor parts formed by the inner electrodes 85, 92, 86, and the fourth capacitor section C4 is constituted by a plurality of capacitor parts formed by the inner electrodes 87, 93, 88. Thus employing assemblies of capacitor parts having a smaller capacitance can shift the resonant frequency to the higher frequency side and enhance voltage resistance as in the modified examples of the first embodiment.

While preferred embodiments of the present invention have been explained in detail in the foregoing, the present invention can be modified in various ways without being restricted to the above-mentioned embodiments. For example, though the above-mentioned embodiments illustrate a number of examples of inner electrodes, the inner electrodes may be disposed differently without being limited thereto. Also, while the above-mentioned embodiments explain quadruple multilayer capacitor arrays by way of example, the present invention is also applicable to octonary multilayer capacitor arrays and the like and capacitor arrays other than multilayer capacitor arrays as long as they are equipped with three or more capacitor sections.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A mounting method of mounting a capacitor array, the capacitor array comprising at least first, second, and third capacitor sections, onto a circuit board formed with a first lead connecting power lines to each other and a second lead for a grounding;
   wherein the capacitor array is capable of being mounted onto the circuit board by using any connection methods of a first connection method of connecting such that the first and second capacitor sections are parallel to each other while the third capacitor section is in series with the parallel first and second capacitor sections; a second connection method of connecting such that the first, second, and third capacitor sections are in series in sequence; and a third connection method of connecting such that the first and second capacitor sections are in series with each other without using the third capacitor section;
   the mounting method comprising mounting the capacitor array onto the circuit board by connecting the capacitor array to the first and second leads by using one connection method of the first connection method, the second connection method, and the third connection method;
   wherein, in the first connection method, one end of each of the first and second capacitor sections on a side unconnected to the third capacitor section is connected to the first lead while the other end of each of the first and second capacitor sections on a side connected to the third capacitor section is connected to the second lead, and one end of the third capacitor section on a side unconnected to the first and second capacitor sections is connected to the first lead while the other end of the third capacitor section on a side connected to the first and second capacitor sections is connected to the second lead;
   wherein, in the second connection method, one end of the first capacitor section on a side unconnected to second capacitor section is connected to the first lead while one end of the second capacitor section on a side connected to the third capacitor section is connected to the second lead, and one end of the third capacitor section on the side unconnected to the second capacitor section is connected to the first lead while the other end of the third capacitor section on a side connected to the second capacitor section is connected to the second lead;

wherein, in third connection method, one end of the first capacitor section on the side unconnected to the second capacitor section is connected to the first lead while the other end of the first capacitor section on the side connected to the second capacitor section is connected to the second lead, and one end of the second capacitor section on a side unconnected to the first capacitor section is connected to the first lead while the other end of the second capacitor section on a side connected to the first capacitor section is connected to the second lead;

wherein the capacitor array is a multilayer capacitor array comprising a capacitor element body having first, second, third, fourth, fifth, and sixth inner electrodes; a first terminal electrode disposed on an outer surface of the capacitor element body and connected to the first inner electrode; a second terminal electrode disposed on the outer surface of the capacitor element body and connected to the second inner electrode; a third terminal electrode disposed on the outer surface of the capacitor element body and connected to the third inner electrode; a fourth terminal electrode disposed on the outer surface of the capacitor element body and connected to the fourth inner electrode; a fifth terminal electrode disposed on the outer surface of the capacitor element body and connected to the fifth inner electrode; and a sixth terminal electrode disposed on the outer surface of the capacitor element body and connected to the sixth inner electrode; and wherein, in the capacitor array, the first and second inner electrodes form the first capacitor section, the third and fourth inner electrodes form the second capacitor section, and the fifth and sixth inner electrodes form the third capacitor section.

2. The mounting method according to claim 1, wherein the first connection method mounts the capacitor array onto the circuit board by connecting the capacitor array to the first and second leads such that one of the first and second terminal electrodes and one of the third and fourth terminal electrodes are connected to the first lead while the other of the first and second terminal electrodes and the other of the third and fourth terminal electrodes are connected to the second lead, and one of the fifth and sixth terminal electrodes is connected to the first lead while the other of the fifth and sixth terminal electrodes is connected to the second lead.

3. The mounting method according to claim 1, wherein the second connection method mounts the capacitor array onto the circuit board by connecting the capacitor array to the first and second leads such that one of the first and second terminal electrodes is connected to the first lead while one of the third and fourth terminal electrodes is connected to the second lead, and one of the fifth and sixth terminal electrodes is connected to the first lead while the other of the fifth and sixth terminal electrodes is connected to the second lead.

4. The mounting method according to claim 1, wherein the third connection method mounts the capacitor array onto the circuit board by connecting the capacitor array to the first and second leads such that one of the first and second terminal electrodes is connected to the first lead while the other of the first and second terminal electrodes is connected to the second lead, and one of the third and fourth terminal electrodes is connected to the first lead while the other of the third and fourth terminal electrodes is connected to the second lead.

5. A mounting method of mounting a capacitor array, the capacitor array comprising at least first, second, and third capacitor sections, onto a circuit board formed with a first lead connecting power lines to each other and a second lead for grounding;

wherein the capacitor array is capable of being mounted onto the circuit board by using any connection methods of a first connection method of connecting such that the first and second capacitor sections are parallel to each other while the third capacitor section is in series with parallel first and second capacitor sections; a second connection method of connecting such that the first, second, and third capacitor sections are in series in sequence; and a third connection method of connecting such that the first and second capacitor sections are in series with each other without using the third capacitor section;

the mounting method comprising mounting the capacitor array onto the circuit board by connecting the capacitor array to the first and second leads by using one connection method of the first connection method, the second connection method, and the third connection method;

wherein, in the first connection method, one end of each of the first and second capacitor sections on a side unconnected to the third capacitor section is connected to the first lead while the other end of each of the first and second capacitor sections on a side connected to the third capacitor section is connected to the second lead, and one end of the third capacitor section on a side unconnected to the first and second capacitor sections is connected to the first lead while the other end of the third capacitor section on a side connected to the first and second capacitor sections is connected to the second lead;

wherein, in the second connection method, one end of the first capacitor section on a side unconnected to the second capacitor section is connected to the first lead while one end of the second capacitor section on a side connected to the third capacitor section is connected to the second lead, and one end of the third capacitor section on the side unconnected to the second capacitor section is connected to the first lead while the other end of the third capacitor section on a side connected to the second capacitor section is connected to the second lead;

wherein, in the third connection method, one end of the first capacitor section on the side unconnected to the second capacitor section is connected to the first lead while the other end of the first capacitor section on the side connected to the second capacitor section is connected to the second lead, and one end of the second capacitor section on a side unconnected to the first capacitor section is connected to the first lead while the other end of the second capacitor section on a side connected to the first capacitor section is connected to the second lead;

wherein the capacitor array is mounted onto the circuit board by using one of the first, second and third connection methods, and the first, second and third capacitor sections of the capacitor array are disconnected with each other within the capacitor array.

6. A mounting method of mounting a capacitor array, the capacitor array compromising at least first, second, and third capacitor sections, onto a circuit board formed with a first lead connecting power lines to each other and a second lead for grounding;

wherein the capacitor array is capable of being mounted onto the circuit board by using any connection methods of a first connection method of connecting such that the first and second capacitor sections are parallel to each other while the third capacitor section is in series with the parallel first and second capacitor sections; a second connection method of connecting such that the first, second, and third capacitor sections are in series in sequence; and a third connection method of connecting such that the first and second capacitor sections are in series with each other without using the third capacitor section;

the mounting method comprising mounting the capacitor array onto the circuit board by connecting the capacitor array to the first and second leads by using one connection method of the first connection method, the second connection method, and the third connection method;

wherein, in the first connection method, one end of each of the first and second capacitor sections on a side unconnected to the third capacitor section is connected to the first lead while the other end of each of the first and second capacitor sections on a side connected to the third capacitor section is connected to the second lead, and one end of the third capacitor section on a side unconnected to the first and second capacitor sections is connected to the first lead while the other end of the third capacitor section on a side connected to the first and second capacitor sections is connected to the second lead;

wherein, in the second connection method, one end of the first capacitor section on a side unconnected to the second capacitor section is connected to the first lead while one end of the second capacitor section on a side connected to the third capacitor section is connected to the second lead, and one end of the third capacitor section on the side unconnected to the second capacitor section is connected to the first lead while the other end of the third capacitor section on a side connected to the second capacitor section is connected to the second lead;

wherein, in the third connection method, one end of the first capacitor section on the side unconnected to the second capacitor section is connected to the first lead while the other end of the first capacitor section on the side connected to the second capacitor section is connected to the second lead, and one end of the second capacitor section on a side unconnected to the first capacitor section is connected to the first lead while the other end of the second capacitor section on a side connected to the first capacitor section is connected to the second lead;

wherein the first, second and third capacitor sections of the capacitor array are arranged in a row at predetermined intervals in a direction perpendicular to a laminating direction of the capacitor array.

7. A mounting method of mounting a capacitor array, the capacitor array compromising at least first, second, and third capacitor sections, onto a circuit board formed with a first lead connecting power lines to each other and a second lead for grounding;

wherein the capacitor array is capable of being mounted onto the circuit board by using any connection methods of a first connection method of connecting such that the first and second capacitor sections are parallel to each other while the third capacitor section is in series with the parallel first and second capacitor sections; a second connection method of connecting such that the first, second, and third capacitor sections are in series in sequence; and a third connection method of connecting such that the first and second capacitor sections are in series with each other without using the third capacitor section;

the mounting method comprising mounting the capacitor array onto the circuit board by connecting the capacitor array to the first and second leads by using one connection method of the first connection method, the second connection method, and the third connection method;

wherein, in the first connection method, one end of each of the first and second capacitor sections on a side unconnected to the third capacitor section is connected to the first lead while the other end of each of the first and second capacitor sections on a side connected to the third capacitor section is connected to the second lead, and one end of the third capacitor section on a side unconnected to the first and second capacitor sections is connected to the first lead while the other end of the third capacitor section on a side connected to the first and second capacitor sections is connected to the second lead;

wherein, in the second connection method, one end of the first capacitor section on a side unconnected to the second capacitor section is connected to the first lead while one end of the second capacitor section on a side connected to the third capacitor section is connected to the second lead, and one end of the third capacitor section on the side unconnected to the second capacitor section is connected to the first lead while the other end of the third capacitor section on a side connected to the second capacitor section is connected to the second lead;

wherein, in the third connection method, one end of the first capacitor section on the side unconnected to the second capacitor section is connected to the first lead while the other end of the first capacitor section on the side connected to the second capacitor section is connected to the second lead, and one end of the second capacitor section on a side unconnected to the first capacitor section is connected to the first lead while the other end of the second capacitor section on a side connected to the first capacitor section is connected to the second lead;

wherein the capacitor array is mounted on the other circuit board so that directions of currents flowing in corresponding to common-mode noise or differential-mode noise are opposite to each other at two regions between first and second terminal electrodes, between third and fourth terminal electrodes, and between fifth and sixth terminal electrodes.

8. A mounting method of mounting a capacitor array, the capacitor array comprising at least first, second, and third capacitor sections onto a circuit board formed with a first lead connecting power lines to each other and a second lead for grounding, wherein the capacitor array is capable of being mounted onto the circuit board by using any connection methods of a first connection method of connecting such that the first and second capacitor sections are parallel to each other while the third capacitor section is in series with the parallel first and second capacitor sections; a second connection method of connecting such that the first, second, and third capacitor sections are in series in sequence; and a third connection method of connecting such that the first and second capacitor sections are in series with each other without using the third capacitor section, the mounting method comprising:

selecting a connection method from among the first connection method, the second connection method, and the third connection method; and mounting the capacitor array onto the circuit board by connecting the capacitor array to the first and second leads by using the selected connection method, wherein, in the first connection method, one end of each of the first and second capacitor sections on a side unconnected to the third capacitor section is connected to the first lead while the other end of each of the first and second capacitor sections on a side connected to the third capacitor section is connected to the second lead, and one end of the third capacitor section on a side unconnected to the first and second capacitor sections is connected to the first lead while the other end of the third capacitor section on a side connected to the first and second capacitor sections is connected to the second lead;

wherein, in the second connection method, one end of the first capacitor section on a side unconnected to the second capacitor section is connected to the first lead while one end of the second capacitor section on a side connected to the third capacitor section is connected to the second lead, and one end of the third capacitor section on the side unconnected to the second capacitor section is connected to the first lead while the other end of the third capacitor section on a side connected to the second capacitor section is connected to the second lead; and wherein, in the third connection method, one end of the first capacitor section on the side unconnected to the second capacitor section is connected to the first lead while the other end of the first capacitor section on the side connected to the second capacitor section is connected to the second lead, and one end of the second capacitor section on a side unconnected to the first capacitor section is connected to the first lead while the other end of the second capacitor section on a side connected to the first capacitor section is connected to the second lead.

9. A mounting method of mounting a capacitor array, the capacitor array comprising at least first, second, and third capacitor sections onto a circuit board formed with a first lead connecting power lines to each other and a second lead for grounding, wherein the capacitor array is capable of being mounted onto the circuit board by using any connection methods of a first connection method of connecting such that the first and second capacitor sections are parallel to each other while the third capacitor section is in series with the parallel first and second capacitor sections; a second connection method of connecting such that the first, second, and third capacitor sections are in series in sequence; and a third connection method of connecting such that the first and second capacitor sections are in series with each other without using the third capacitor section, the mounting method comprising:

making available three connection methods including the first, second and third connection methods, wherein, in the first connection method, one end of each of the first and second capacitor sections on a side unconnected to the third capacitor section is connected to the first lead while the other end of each of the first and second capacitor sections on a side connected to the third capacitor section is connected to the second lead, and one end of the third capacitor section on a side unconnected to the first and second capacitor sections is connected to the first lead while the other end of the third capacitor section on a side connected to the first and second capacitor sections is connected to the second lead;

wherein, in the second connection method, one end of the first capacitor section on a side unconnected to the second capacitor section is connected to the first lead while one end of the second capacitor section on a side connected to the third capacitor section is connected to the second lead, and one end of the third capacitor section on the side unconnected to the second capacitor section is connected to the first lead while the other end of the third capacitor section on a side connected to the second capacitor section is connected to the second lead; and wherein, in the third connection method, one end of the first capacitor section on the side unconnected to the second capacitor section is connected to the first lead while the other end of the first capacitor section on the side connected to the second capacitor section is connected to the second lead, and one end of the second capacitor section on a side unconnected to the first capacitor section is connected to the first lead while the other end of the second capacitor section on a side connected to the first capacitor section is connected to the second lead; and mounting the capacitor array onto the circuit board by connecting the capacitor array to the first and second leads by using a selected one of the three connection methods.

\* \* \* \* \*